(12) United States Patent
Port et al.

(10) Patent No.: US 12,154,587 B2
(45) Date of Patent: Nov. 26, 2024

(54) MULTIBAND LIMITER MODES AND NOISE COMPENSATION METHODS

(71) Applicant: DOLBY LABORATORIES LICENSING CORPORATION, San Francisco, CA (US)

(72) Inventors: Timothy Alan Port, Drummoyne (AU); Benjamin Alexander Jancovich, Arncliffe (AU)

(73) Assignee: DOLBY LABORATORIES LICENSING CORPORATION, San Francisco, CA (US)

(*) Notice: Subject to any disclaimer, the term of this patent is extended or adjusted under 35 U.S.C. 154(b) by 161 days.

(21) Appl. No.: 17/784,071

(22) PCT Filed: Dec. 9, 2020

(86) PCT No.: PCT/US2020/064103
§ 371 (c)(1),
(2) Date: Jun. 9, 2022

(87) PCT Pub. No.: WO2021/119190
PCT Pub. Date: Jun. 17, 2021

(65) Prior Publication Data
US 2023/0044872 A1    Feb. 9, 2023

Related U.S. Application Data

(60) Provisional application No. 63/198,999, filed on Nov. 30, 2020, provisional application No. 63/198,998, (Continued)

(51) Int. Cl.
*G10L 21/0232* (2013.01)
*G06F 3/16* (2006.01)
(Continued)

(52) U.S. Cl.
CPC .......... *G10L 21/0232* (2013.01); *G06F 3/162* (2013.01); *G06F 3/165* (2013.01); (Continued)

(58) Field of Classification Search
CPC ..... G10L 21/0232; G10L 15/22; G10L 25/51; G10L 2015/223; G10L 2021/02082; (Continued)

(56) References Cited

U.S. PATENT DOCUMENTS 4,629,829 A   12/1986   Puhl
5,907,622 A    5/1999   Dougherty
(Continued)

FOREIGN PATENT DOCUMENTS

CN   106105262 A   11/2016
CN   108630217 A   10/2018
(Continued)

OTHER PUBLICATIONS

Dalskov, D., Locating Acoustic Sources with Multilateration—Applied to Stationary and Moving Sources, (Aalborg University, Jun. 4, 2014).
(Continued)

*Primary Examiner* — Oyesola C Ojo

(57) ABSTRACT

Some implementations involve receiving a content stream that includes audio data, receiving at least one type of level adjustment indication relating to playback of the audio data and controlling a level of the input audio data, based on the at least one type of level adjustment indication, to produce level-adjusted audio data. Some examples involve determining, based at least in part on the type(s) of level adjustment indication, a multiband limiter configuration, applying the multiband limiter to the level-adjusted audio data, to produce multiband limited audio data and providing the mul-
(Continued)

tiband limited audio data to one or more audio reproduction transducers of an audio environment.

21 Claims, 17 Drawing Sheets

Related U.S. Application Data filed on Nov. 30, 2020, provisional application No. 63/198,997, filed on Nov. 30, 2020, provisional application No. 63/198,996, filed on Nov. 30, 2020, provisional application No. 63/198,995, filed on Nov. 30, 2020, provisional application No. 62/945,607, filed on Dec. 9, 2019, provisional application No. 62/945,303, filed on Dec. 9, 2019, provisional application No. 62/945,292, filed on Dec. 9, 2019.

(51) Int. Cl.
| | | |
|---|---|---|
| G10L 15/22 | (2006.01) | |
| G10L 25/51 | (2013.01) | |
| H03G 3/32 | (2006.01) | |
| H03G 9/02 | (2006.01) | |
| H04M 9/08 | (2006.01) | |
| H04R 1/08 | (2006.01) | |
| H04R 1/40 | (2006.01) | |
| H04R 3/00 | (2006.01) | |
| H04R 3/02 | (2006.01) | |
| H04R 3/04 | (2006.01) | |
| H04R 3/12 | (2006.01) | |
| H04R 29/00 | (2006.01) | |

(52) U.S. Cl.
CPC ............. *G10L 15/22* (2013.01); *G10L 25/51* (2013.01); *H03G 3/32* (2013.01); *H03G 9/025* (2013.01); *H04M 9/082* (2013.01); *H04R 1/08* (2013.01); *H04R 1/403* (2013.01); *H04R 1/406* (2013.01); *H04R 3/005* (2013.01); *H04R 3/02* (2013.01); *H04R 3/04* (2013.01); *H04R 3/12* (2013.01); *H04R 29/001* (2013.01); *H04R 29/002* (2013.01); *G10L 2015/223* (2013.01); *H04R 2420/07* (2013.01); *H04R 2430/01* (2013.01)

(58) Field of Classification Search
CPC ..... G10L 21/0208; G06F 3/162; G06F 3/165; H03G 3/32; H03G 9/025; H03G 9/005; H04M 9/082; H04R 1/08; H04R 1/403; H04R 1/406; H04R 3/005; H04R 3/02; H04R 3/04; H04R 3/12; H04R 29/001; H04R 29/002; H04R 2420/07; H04R 2430/01; H04R 2430/03; H04R 1/1083; H04R 3/007; H04R 2227/001; H04S 2400/13; H04S 7/30; H04S 7/301; H04S 7/302; H04S 7/305
See application file for complete search history.

(56) References Cited

U.S. PATENT DOCUMENTS

| | | |
|---|---|---|
| 5,933,506 A | 8/1999 | Aoki |
| 6,708,145 B1 | 3/2004 | Liljeryd |
| 7,333,618 B2 | 2/2008 | Shuttleworth |
| 7,519,189 B2 | 4/2009 | Bongiovi |
| 7,760,893 B1 | 7/2010 | Felber |
| 7,889,943 B1 | 2/2011 | Christian |
| 8,090,120 B2 | 1/2012 | Seefeldt |
| 8,112,166 B2 | 2/2012 | Pavlovic |
| 8,244,196 B2 | 8/2012 | Yang |
| 8,285,344 B2 | 10/2012 | Kahn |
| 8,447,045 B1 | 5/2013 | Laroche |
| 8,565,442 B2 | 10/2013 | Maeda |
| 8,660,281 B2 | 2/2014 | Bouchard |
| 8,797,465 B2 | 8/2014 | Hardacker |
| 9,076,456 B1 | 7/2015 | Avendano |
| 9,159,335 B2 | 10/2015 | Kim |
| 9,183,845 B1 | 11/2015 | Gopalakrishnan |
| 9,240,176 B2 | 1/2016 | Tzirkel-Hancock |
| 9,368,099 B2 | 6/2016 | Alderson |
| 9,426,598 B2 | 8/2016 | Walsh |
| 9,609,141 B2 | 3/2017 | Beaucoup |
| 9,648,436 B2 | 5/2017 | Kraft |
| 9,699,556 B2 | 7/2017 | Aggarwal |
| 9,729,969 B2 | 8/2017 | Risberg |
| 9,792,892 B2 | 10/2017 | Gul |
| 9,842,605 B2 | 12/2017 | Lu |
| 10,229,698 B1 | 3/2019 | Chhetri |
| 10,242,689 B2 | 3/2019 | Chatlani |
| 10,355,658 B1* | 7/2019 | Yang ..................... H03G 9/025 |
| 10,389,321 B2 | 8/2019 | Seefeldt |
| 11,232,807 B2 | 1/2022 | Hines |
| 11,688,409 B2* | 6/2023 | Gorny ................... H03G 9/005 |
| | | 704/500 |
| 11,877,129 B2* | 1/2024 | Kron .................... H03G 7/007 |
| 2002/0181698 A1* | 12/2002 | Takahashi ........... G10L 21/0208 |
| | | 379/406.01 |
| 2005/0260985 A1 | 11/2005 | Rader |
| 2007/0242837 A1 | 10/2007 | Glen |
| 2008/0025530 A1 | 1/2008 | Romesburg |
| 2008/0247536 A1 | 10/2008 | Rahbar |
| 2008/0269926 A1 | 10/2008 | Xiang |
| 2009/0274310 A1 | 11/2009 | Taenzer |
| 2010/0166225 A1 | 7/2010 | Watanabe |
| 2010/0172510 A1 | 7/2010 | Juvonen |
| 2011/0251704 A1 | 10/2011 | Walsh |
| 2012/0230501 A1 | 9/2012 | Ganter |
| 2012/0328114 A1 | 12/2012 | Takeuchi |
| 2013/0013096 A1 | 1/2013 | Seefeldt |
| 2013/0054251 A1 | 2/2013 | Eppolito |
| 2013/0315405 A1 | 11/2013 | Kanishima |
| 2014/0334631 A1* | 11/2014 | de Vicente Pena ....................... |
| | | G10L 21/0208 |
| | | 381/71.1 |
| 2014/0337016 A1 | 11/2014 | Herbig |
| 2015/0010168 A1* | 1/2015 | Cheng ................... H04R 3/007 |
| | | 381/107 |
| 2015/0154977 A1 | 6/2015 | Ekman |
| 2015/0205571 A1* | 7/2015 | Duwenhorst ........ G11B 27/031 |
| | | 700/94 |
| 2015/0332685 A1 | 11/2015 | Bleidt |
| 2016/0163327 A1 | 6/2016 | Christoph |
| 2017/0061982 A1* | 3/2017 | Pakarinen .............. H03G 5/005 |
| 2017/0245083 A1 | 8/2017 | Kordon |
| 2017/0289682 A1* | 10/2017 | Goesnar ............... H04R 29/001 |
| 2019/0066672 A1 | 2/2019 | Wood |
| 2019/0082140 A1 | 3/2019 | Einarsson |
| 2019/0123841 A1* | 4/2019 | Keith ..................... H04H 20/72 |
| 2019/0158957 A1* | 5/2019 | Breebaart ............... H04M 1/03 |
| 2019/0165832 A1* | 5/2019 | Khanduri ............... H04B 3/237 |
| 2019/0199309 A1 | 6/2019 | Seefeldt |
| 2019/0304431 A1 | 10/2019 | Cardinaux |
| 2019/0305743 A1 | 10/2019 | Ramos |
| 2019/0372541 A1 | 12/2019 | Friant |
| 2020/0092646 A1 | 3/2020 | Yamamoto |
| 2021/0012789 A1* | 1/2021 | Husain .................... H04R 3/02 |
| 2021/0265966 A1 | 8/2021 | Port |
| 2021/0273623 A1 | 9/2021 | Port |

FOREIGN PATENT DOCUMENTS

| | | |
|---|---|---|
| EP | 0993670 B1 | 3/2002 |
| EP | 1414021 B1 | 5/2008 |
| EP | 1978649 A2 | 10/2008 |
| EP | 3226412 B1 | 10/2021 |
| JP | 2011528806 A | 11/2011 |
| JP | 2013532308 A | 8/2013 |
| JP | 2017085329 A | 5/2017 |

(56) References Cited

FOREIGN PATENT DOCUMENTS

| WO | 2011019339 A1 | 2/2011 |
| WO | 2018211908 A1 | 11/2018 |
| WO | 2019209973 A1 | 10/2019 |
| WO | 2021034625 A1 | 2/2021 |

OTHER PUBLICATIONS

ISO/IEC 23003-4:2015 (MPEG-D Part 4: Dynamic Range Control) standard.
Lianga, R. et al "An Improved Method to Enhance High-Frequency Speech Intelligibility in Noise" Applied Acoustics, vol. 74, Issue 1, Jan. 2013.
Park, J.S. "Acoustic Interference cancellation for a Voice-Driven Interface in Smart TVs" IEEE vol. 59, Issue 1, Feb. 2013, pp. 244-249.
Shrawankar, U. et al "Acoustic Echo Cancellation Postfilter Design Issues For Speech Recognition System" International Journal of Science and Advanced Technology, vol. 1, No. 5, Jul. 2011, pp. 38-43.

\* cited by examiner

MULTIBAND LIMITER MODES AND NOISE COMPENSATION METHODS

CROSS REFERENCE TO RELATED APPLCIATIONS

This application claims priority to U.S. Provisional Application Nos. 62/945,292, filed Dec. 9, 2019; 63/198,995, filed Nov. 30, 2020; 62/945,303, filed Dec. 9, 2019; 63/198,996, filed Nov. 30, 2020; 63/198,997, filed Nov. 30, 2020; 62/945,607, filed Dec. 9, 2019; 63/198,998, filed Nov. 30, 2020; and 63/198,999, filed Nov. 30, 2020, each of which is incorporated by reference in its entirety.

TECHNICAL FIELD

This disclosure pertains to systems and methods for noise compensation.

BACKGROUND

Audio and video devices, including but not limited to televisions and associated audio devices, are widely deployed. Some such devices are configured to implement noise compensation algorithms, which attempt to compensate for noise within an environment. Although existing systems and methods for noise compensation provide benefits, improved systems and methods would be desirable.

NOTATION AND NOMENCLATURE

Throughout this disclosure, including in the claims, the terms "speaker," "loudspeaker" and "audio reproduction transducer" are used synonymously to denote any sound-emitting transducer (or set of transducers) driven by a single speaker feed. A typical set of headphones includes two speakers. A speaker may be implemented to include multiple transducers (e.g., a woofer and a tweeter), which may be driven by a single, common speaker feed or multiple speaker feeds. In some examples, the speaker feed(s) may undergo different processing in different circuitry branches coupled to the different transducers.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

As used herein, a "smart device" is an electronic device, generally configured for communication with one or more other devices (or networks) via various wireless protocols such as Bluetooth, Zigbee, near-field communication, Wi-Fi, light fidelity (Li-Fi), 3G, 4G, 5G, etc., that can operate to some extent interactively and/or autonomously. Several notable types of smart devices are smartphones, smart cars, smart thermostats, smart doorbells, smart locks, smart refrigerators, phablets and tablets, smartwatches, smart bands, smart key chains and smart audio devices. The term "smart device" may also refer to a device that exhibits some properties of ubiquitous computing, such as artificial intelligence.

Herein, we use the expression "smart audio device" to denote a smart device which is either a single-purpose audio device or a multi-purpose audio device (e.g., an audio device that implements at least some aspects of virtual assistant functionality). A single-purpose audio device is a device (e.g., a television (TV)) including or coupled to at least one microphone (and optionally also including or coupled to at least one speaker and/or at least one camera), and which is designed largely or primarily to achieve a single purpose. For example, although a TV typically can play (and is thought of as being capable of playing) audio from program material, in most instances a modern TV runs some operating system on which applications run locally, including the application of watching television. In this sense, a single-purpose audio device having speaker(s) and microphone(s) is often configured to run a local application and/or service to use the speaker(s) and microphone(s) directly. Some single-purpose audio devices may be configured to group together to achieve playing of audio over a zone or user configured area.

One common type of multi-purpose audio device is an audio device that implements at least some aspects of virtual assistant functionality, although other aspects of virtual assistant functionality may be implemented by one or more other devices, such as one or more servers with which the multi-purpose audio device is configured for communication. Such a multi-purpose audio device may be referred to herein as a "virtual assistant." A virtual assistant is a device (e.g., a smart speaker or voice assistant integrated device) including or coupled to at least one microphone (and optionally also including or coupled to at least one speaker and/or at least one camera). In some examples, a virtual assistant may provide an ability to utilize multiple devices (distinct from the virtual assistant) for applications that are in a sense cloud-enabled or otherwise not completely implemented in or on the virtual assistant itself. In other words, at least some aspects of virtual assistant functionality, e.g., speech recognition functionality, may be implemented (at least in part) by one or more servers or other devices with which a virtual assistant may communication via a network, such as the Internet. Virtual assistants may sometimes work together, e.g., in a discrete and conditionally defined way. For example, two or more virtual assistants may work together in the sense that one of them, e.g., the one which is most confident that it has heard a wakeword, responds to the wakeword. The connected virtual assistants may, in some implementations, form a sort of constellation, which may be managed by one main application which may be (or implement) a virtual assistant.

Herein, "wakeword" is used in a broad sense to denote any sound (e.g., a word uttered by a human, or some other sound), where a smart audio device is configured to awake in response to detection of ("hearing") the sound (using at least one microphone included in or coupled to the smart audio device, or at least one other microphone). In this context, to "awake" denotes that the device enters a state in which it awaits (in other words, is listening for) a sound command In some instances, what may be referred to herein as a "wakeword" may include more than one word, e.g., a phrase.

Herein, the expression "wakeword detector" denotes a device configured (or software that includes instructions for configuring a device) to search continuously for alignment between real-time sound (e.g., speech) features and a trained model. Typically, a wakeword event is triggered whenever it is determined by a wakeword detector that the probability that a wakeword has been detected exceeds a predefined threshold. For example, the threshold may be a predetermined threshold which is tuned to give a reasonable compromise between rates of false acceptance and false rejection. Following a wakeword event, a device might enter a state (which may be referred to as an "awakened" state or a state of "attentiveness") in which it listens for a command and passes on a received command to a larger, more computationally-intensive recognizer.

As used herein, the terms "program stream" and "content stream" refer to a collection of one or more audio signals, and in some instances video signals, at least portions of which are meant to be heard together. Examples include a selection of music, a movie soundtrack, a movie, a television program, the audio portion of a television program, a podcast, a live voice call, a synthesized voice response from a smart assistant, etc. In some instances, the content stream may include multiple versions of at least a portion of the audio signals, e.g., the same dialogue in more than one language. In such instances, only one version of the audio data or portion thereof (e.g., a version corresponding to a single language) is intended to be reproduced at one time.

SUMMARY

At least some aspects of the present disclosure may be implemented via one or more audio processing methods, including but not limited to content stream processing methods. In some instances, the method(s) may be implemented, at least in part, by a control system and/or via instructions (e.g., software) stored on one or more non-transitory media. Some such methods involve receiving, by a control system and via an interface system, a content stream that includes input audio data. Some such methods involve receiving, by the control system and via the interface system, at least one type of level adjustment indication relating to playback of the audio data. Some such methods involve controlling, by the control system, a level of the input audio data, based on the at least one type of level adjustment indication, to produce level-adjusted audio data. Some such methods involve determining, by the control system and based at least in part on the at least one type of level adjustment indication, a multiband limiter configuration. Some such methods involve configuring, by the control system, a multiband limiter according to the multiband limiter configuration. Some such methods involve applying the multiband limiter to the level-adjusted audio data, to produce multiband limited audio data. Some such methods involve providing the multiband limited audio data to one or more audio reproduction transducers of an audio environment.

According to some implementations, the at least one type of level adjustment indication may include a user input level adjustment indication received via user input and/or a noise compensation level adjustment indication received from a noise compensation module. In some examples, if receiving the at least one type of level adjustment indication involves receiving the user input level adjustment indication, determining the multiband limiter configuration may involve determining a timbre-preserving configuration. According to some examples, if receiving the at least one type of level adjustment indication involves receiving the noise compensation level adjustment indication, determining the multiband limiter configuration may involve changing a timbre-preserving functionality. In some instances, changing the timbre-preserving functionality may involve at least partially disabling the timbre-preserving functionality. According to some examples, the noise compensation level adjustment indication may correspond with a level of ambient noise in the audio environment. In some such examples, changing the timbre-preserving functionality may involve changing the timbre-preserving functionality based, at least in part, on the level of ambient noise. Changing the timbre-preserving functionality may, in some instances, be based at least in part on the level of ambient noise. Some examples may involve reproducing the multiband limited audio data on the one or more audio reproduction transducers of the audio environment to provide reproduced audio data. Some such examples may involve determining or estimating a masking effect of the level of ambient noise on the reproduced audio data. In some instances, changing the timbre-preserving functionality may be based, at least in part, on the masking effect. In some examples, the timbre-preserving configuration may be frequency band dependent.

In some instances, receiving the at least one type of level adjustment indication may involve receiving both the user input level adjustment indication and the noise compensation level adjustment indication. In some such examples, determining the multiband limiter configuration may involve determining a timbre-preserving configuration that is based, at least in part, on a weighted average of the user input level adjustment indication and the noise compensation level adjustment indication.

Some examples also may involve causing a noise compensation module operation change when the multiband limited audio data causes one or more audio reproduction transducers of the audio environment to operate outside a linear range. In some instances, the control system may cause the one or more audio reproduction transducers of the audio environment to operate outside the linear range based, at least in part, on a noise compensation level adjustment indication and/or a noise estimate. In some examples, the noise compensation module operation change may involve changing an echo canceller functionality of the noise compensation module. According to some examples, the noise compensation module operation change may involve causing the noise compensation module to use only quiet playback intervals as input to a noise estimator of the noise compensation module. The quiet playback intervals may be instances of audio signals at or below a threshold level in at least one frequency band and/or at least one time interval. In some instances, the multiband limited audio data that causes one or more audio reproduction transducers of the audio environment to operate outside a linear range may be based on a noise compensation level adjustment that corresponds to a high level of ambient noise in the audio environment.

According to some implementations, the noise compensation module may be a subsystem of the control system. In some examples, a level adjuster module of the control system may be configured for controlling the level of the input audio data to produce the level-adjusted audio data. According to some such examples, a method also may involve providing multiband limiter feedback from the multiband limiter to the level adjuster module. In some instances, the multiband limiter feedback may indicate an amount of limiting that the multiband limiter is applying to each of a plurality of frequency bands of the level-adjusted audio data. Some examples also may involve controlling, by the level adjuster module, a level of one or more frequency bands of the plurality of frequency bands based, at least in part, on the multiband limiter feedback.

Some alternative aspects of the present disclosure also may be implemented via one or more audio processing methods, including but not limited to content stream processing methods. In some instances, the method(s) may be implemented, at least in part, by a control system and/or via instructions (e.g., software) stored on one or more non-transitory media. Some such methods involve receiving, by a control system and via an interface system, a content stream that includes input audio data and applying, by the control system, a multiband limiter to the audio data or to a processed version of the audio data, to produce multiband limited audio data. Some such methods involve determining whether the multiband limited audio data would cause one or more audio reproduction transducers of an audio environment to operate outside a linear range when played back over the one or more audio reproduction transducers and controlling, by the control system, whether an acoustic echo canceller updates one or more filter coefficients or whether a noise estimator updates a noise estimate based at least in part upon whether the multiband limited audio data would cause the one or more audio reproduction transducers of the audio environment to operate outside the linear range. Some such methods involve providing the multiband limited audio data to the one or more audio reproduction transducers of the audio environment.

In some examples, controlling whether the acoustic echo canceller updates the one or more filter coefficients may involve controlling the acoustic echo canceller to not update the one or more filter coefficients if the multiband limited audio data would cause the one or more audio reproduction transducers of the audio environment to operate outside the linear range. Some implementations may involve receiving, by the control system, at least one type of level adjustment indication relating to playback of the audio data, determining, by the control system and based at least in part on the at least one type of level adjustment indication, a multiband limiter configuration and configuring, by the control system, the multiband limiter according to the multiband limiter configuration. Some such examples also may involve controlling, by the control system, a level of the input audio data, based on the at least one type of level adjustment indication, to produce level-adjusted audio data. Applying the multiband limiter to the audio data or to the processed version of the audio data may involve applying the multiband limiter to the level-adjusted audio data. In some examples, the at least one type of level adjustment indication may include a user input level adjustment indication received via user input and/or a noise compensation level adjustment indication received from a noise compensation module that includes the acoustic echo canceller. According to some examples, if receiving the at least one type of level adjustment indication involves receiving the user input level adjustment indication, determining the multiband limiter configuration may involve determining a timbre-preserving configuration.

According to some implementations, if receiving the at least one type of level adjustment indication involves receiving the noise compensation level adjustment indication, determining the multiband limiter configuration may involve changing a timbre-preserving functionality. In some instances, changing the timbre-preserving functionality may involve at least partially disabling the timbre-preserving functionality. In some examples, the noise compensation level adjustment indication may correspond with a level of ambient noise in the audio environment. In some such examples, changing the timbre-preserving functionality may involve changing the timbre-preserving functionality based, at least in part, on the level of ambient noise. Some examples also may involve reproducing the multiband limited audio data on the one or more audio reproduction transducers of the audio environment to provide reproduced audio data. Some such examples also may involve determining or estimating a masking effect of the level of ambient noise on the reproduced audio data. Changing the timbre-preserving functionality may be based, at least in part, on the masking effect. In some examples, the timbre-preserving configuration may be frequency band dependent.

In some examples, receiving the at least one type of level adjustment indication may involve receiving both the user input level adjustment indication and the noise compensation level adjustment indication. In some such examples, determining the multiband limiter configuration may involve determining a timbre-preserving configuration that is based, at least in part, on a weighted average of the user input level adjustment indication and the noise compensation level adjustment indication.

According to some implementations, the control system may cause the one or more audio reproduction transducers of the audio environment to operate outside the linear range based, at least in part, on a noise compensation level adjustment indication and/or a noise estimate. In some such examples, the control system may causes the one or more audio reproduction transducers of the audio environment to operate outside a linear range based, at least in part, on a noise compensation level adjustment that corresponds to a high level of ambient noise in the audio environment.

Some examples may involve causing one or more additional noise compensation module operation changes when the multiband limited audio data causes one or more audio reproduction transducers of the audio environment to operate outside the linear range. The additional noise compensation module operation change(s) may involve causing the noise compensation module to use only quiet playback intervals as input to a noise estimator of the noise compensation module. The quiet playback intervals may be instances of audio signals at or below a threshold level in at least one frequency band and/or instances of audio signals at or below a threshold level during at least one time interval. In some implementations, the noise compensation module may be a subsystem of the control system.

According to some examples, a level adjuster module of the control system may be configured for controlling the level of the input audio data to produce the level-adjusted audio data. Some such examples also may involve providing multiband limiter feedback from the multiband limiter to the level adjuster module. The multiband limiter feedback may, for example, indicate an amount of limiting that the multiband limiter is applying to each of a plurality of frequency bands of the level-adjusted audio data. Some such examples also may involve controlling, by the level adjuster module, a level of one or more frequency bands of the plurality of frequency bands based, at least in part, on the multiband limiter feedback.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented via one or more non-transitory media having software stored thereon.

At least some aspects of the present disclosure may be implemented via apparatus. For example, one or more devices may be capable of performing, at least in part, the methods disclosed herein. In some implementations, an apparatus is, or includes, an audio processing system having an interface system and a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 1O shows a more detailed version of FIG. 1N, according to one example.

Like reference numbers and designations in the various drawings indicate like elements.

DETAILED DESCRIPTION OF EMBODIMENTS

Noise compensation algorithms are designed to compensate for noise in what may be referred to herein as an "audio environment." As used herein, the term "audio environment" is not limited to components of an audio system, such as audio reproduction transducers, amplifiers, etc. Instead, the term "audio environment" refers generally to an environment in which such components may reside and/or an environment in which one or more listeners may listen to played-back audio. The audio environment may, in some examples, be a home audio environment. In such instances, the audio environment may correspond with one or more rooms of a home. In other examples, the audio environment may be an office environment, an automobile environment, a train or bus environment, a street or sidewalk environment, a park or other outdoor environment, or another type of environment.

Noise compensation methods may, for example, be designed to compensate for noise within the audio environment by adjusting the level of an output signal through one or more audio reproduction transducers, based at least in part on the amount of noise within the audio environment. One of the challenges of implementing noise compensation methods is that there is a limited range within which an audio reproduction transducer performs linearly in the physical world.

Figure 1C:
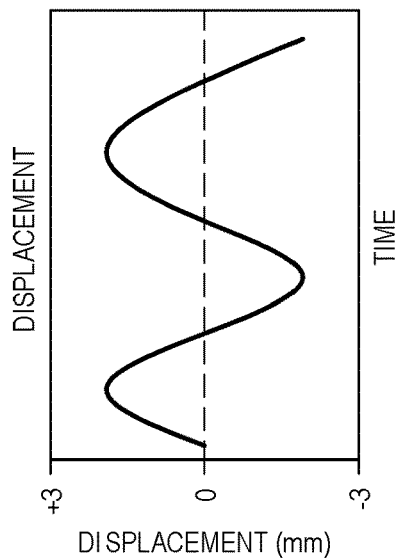
FIGS. 1A, 1B and 1C show examples of loudspeaker operation in a linear range.
Figure 1B:
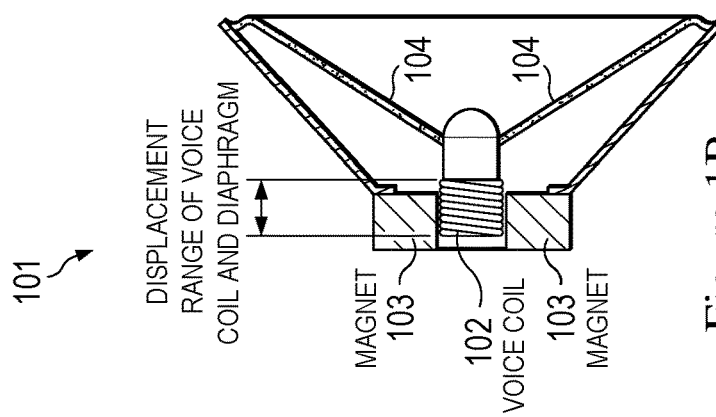
Figure 1A:
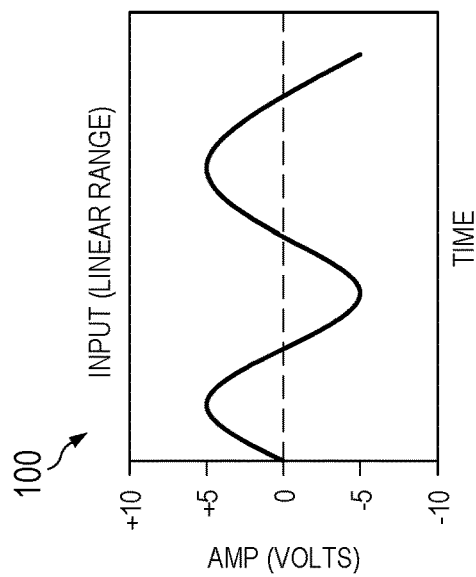

FIGS. 1A, 1B and 1C show examples of loudspeaker operation in a linear range. FIG. 1A is a graph that provides an example of signals 100 output by an amplifier and provided to a loudspeaker 101. FIG. 1B shows an example of a cross-section through the loudspeaker 101. In this example, the signals 100 are sinusoidal input signals having a peak-to-peak range of 10 Volts. Signals within this range, when provided to the loudspeaker 101, cause a range of voice coil displacement in which the voice coil 102 remains within the part of the magnetic field produced by the magnet 103 that is homogeneous, or substantially homogeneous, in field strength. Accordingly, the displacement of the voice coil 102 and the diaphragm 104 are in a linear range.

FIG. 1C is a graph that shows an example of the displacement of the voice coil 102 and the diaphragm 104 when the loudspeaker 101 is driven by the signals 100. In this example, the displacement is sinusoidal and proportional to the input voltages of the signals 100. Accordingly, the signals 100 produce no distortion and the loudspeaker 101 operates in a linear range.

Figure 1F:
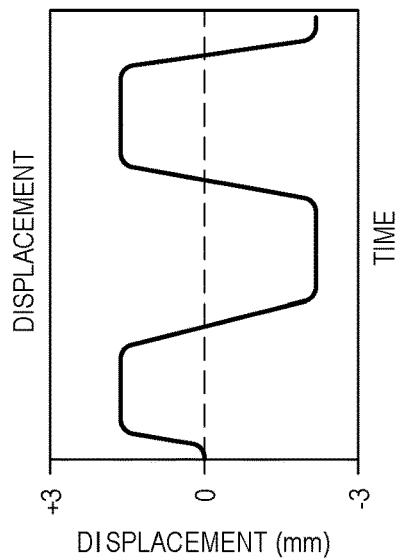
FIGS. 1D, 1E and 1F show examples of loudspeaker operation in a non-linear range.
Figure 1E:
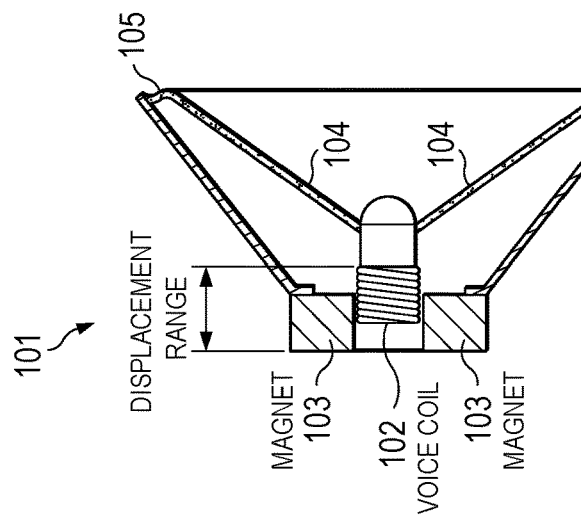
Figure 1D:
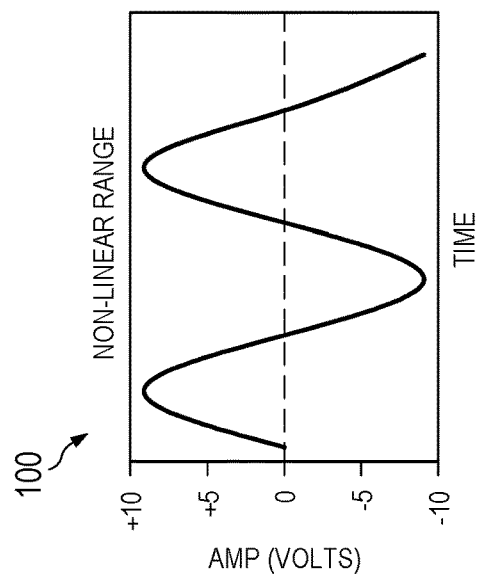

When audio devices such as reproduction transducers operate outside of the linear range, the audio devices distort and may sound unpleasant. FIGS. 1D, 1E and 1F show examples of loudspeaker operation in a non-linear range. FIG. 1D is a graph that provides another example of signals 100 output by an amplifier and provided to a loudspeaker 101. FIG. 1E shows another example of a cross-section through the loudspeaker 101. In this example, the signals 100 are sinusoidal input signals having a peak-to-peak range of 20 Volts. Signals within this range, when provided to the loudspeaker 101, cause a range of voice coil displacement in which the voice coil 102 does not always remain within the part of the magnetic field produced by the magnet 103 that is homogeneous, or substantially homogeneous, in field strength. Accordingly, the displacement of the voice coil 102 and the diaphragm 104 are in a non-linear range. Another source of non-linearity in the loudspeaker 101 is suspension elasticity. The diaphragm 104 is connected to the frame at its perimeter by the suspension 105. As the diaphragm 104 moves forward and backwards, the suspension 105 stretches to accommodate this motion. The elasticity of this material has a limit, however, and as the diaphragm 104 is driven harder, and the motion of the diaphragm 104 approaches the extremes of this limit, the driving force causing motion is less able to overcome the opposing force of the elastic suspension 105 as it tries to return to its neutral position. As with the magnetic non-linearity, this condition results in an output signal that is no longer the same as the input.

FIG. 1F is a graph that shows an example of the displacement of the voice coil 102 and the diaphragm 104 when the loudspeaker 101 is driven by the signals 100. In this example, the displacement is non-sinusoidal and not proportional to the input voltages of the signals 100. Instead of being proportional to the input voltages, the output shown in FIG. 1F corresponds to both the input voltages and to loudspeaker distortion effects. Therefore, in this example the signals 100 produce distortion and the loudspeaker 101 operates in a non-linear range.

Echo cancellers, which often are implemented via adaptive linear filters or via machine learning (e.g., via a trained neural network), are essential components to many noise compensation systems. Echo cancellers perform much worse when adapting to non-linear systems (e.g., in response to loudspeakers operating in a non-linear range), if the echo cancellers adapt successfully at all. Furthermore, extended loudspeaker operation in the non-linear range is likely to cause damage to the loudspeaker.

Multiband limiters allow frequency-dependent control over a loudspeaker's dynamic range. Multiband limiters are normally configured to increase the sound pressure that a loudspeaker is capable of producing while ensuring the loudspeaker does not introduce non-linear distortion.

Figure 1I:
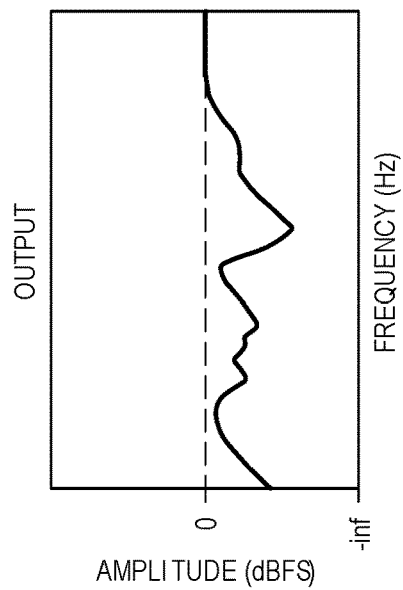
FIGS. 1G, 1H and 1I show examples of multiband limiter operation.
Figure 1H:
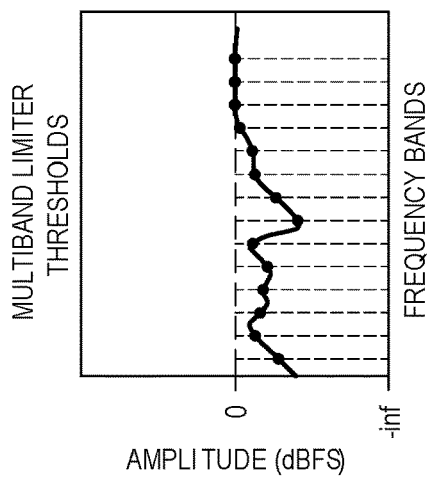
Figure 1G:
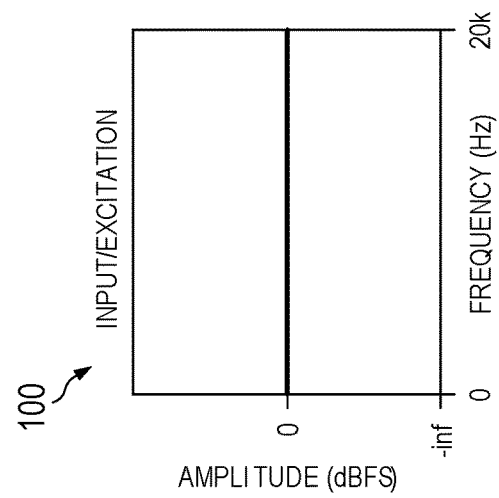

FIGS. 1G, 1H and 1I show examples of multiband limiter operation. FIG. 1G is a graph that provides an example of audio signals 100 provided to a multiband limiter. In this example, the audio signals 100 correspond to a "white" input spectrum, in which the level is the same for each frequency band.

FIG. 1H shows examples of multiband limiter thresholds for each of a plurality of frequency bands. In this example, each of the thresholds is at or below the level of the input audio signals 100. The multiband limiter thresholds may, for example, correspond to the capabilities (e.g., the distortion profile) of a particular loudspeaker and may be implemented by or for that loudspeaker. In some such examples, the multiband limiter thresholds may be pre-set at a factory at which the loudspeaker is made.

FIG. 1I is a graph that shows an example of the output of a multiband limiter having the thresholds shown in FIG. 1H, when provided with the input audio signals 100 shown in FIG. 1G. In this example, because each of the thresholds is at or below the level of the input audio signals 100, the output for each frequency band corresponds to the multiband limiter threshold for that frequency band. Accordingly, the frequency content or timbre of the input audio signals 100 was not preserved in this example.

As shown in the foregoing example, a multiband limiter can significantly change the spectral content or timbre of an input audio signal. Allowing a multiband limiter to operate unconstrained can detrimentally affect the timbre of the output audio signals, thus potentially decreasing the level of enjoyment of musical content.

Figure 1L:
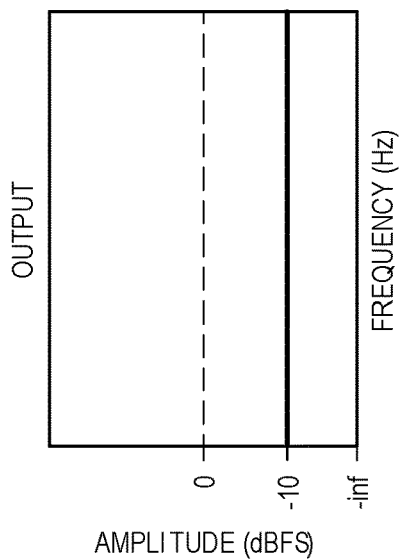
FIGS. 1J, 1K and 1L show examples of timbre-preserving multiband limiter operation according to one implementation.
Figure 1K:
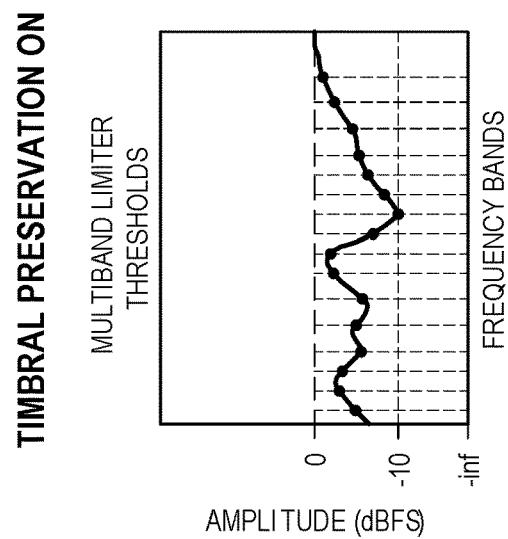
Figure 1J:
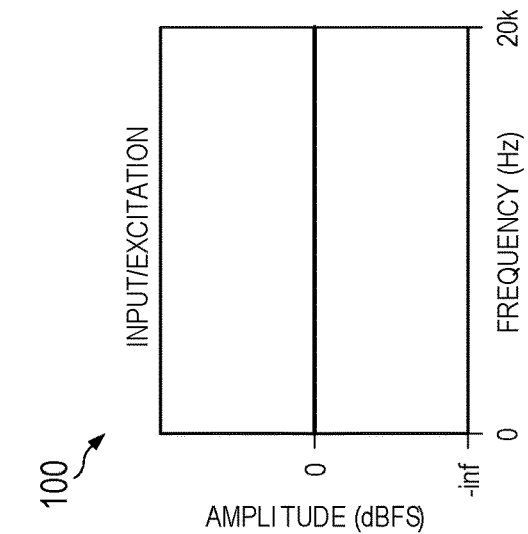

Some multiband limiters developed by the present assignee can at least partially preserve the timbre of timbre of an input audio signal. FIGS. 1J, 1K and 1L show examples of timbre-preserving multiband limiter operation according to one implementation. The term "timbre-preserving" may have a variety of meanings as used herein. Broadly speaking, a "timbre-preserving" method is one that at least partially preserves the frequency content, or timbre of an input audio signal. Some timbre-preserving methods may completely, or almost completely, preserve the frequency content of an input audio signal. A timbre-preserving method may involve constraining the output signal level of at least some frequency bands according to the output signal level and/or imposed thresholds of at least some other frequency bands. In some examples, a "timbre-preserving" method may involve constraining, at least to some degree, the output signal level of all non-isolated frequency bands. However, as described in more detail herein, in some examples a frequency band may be entirely isolated, whereas in other examples a frequency band may be only partially isolated.

FIG. 1J is a graph that provides an example of audio signals 100 provided to a multiband limiter. In this example, as in FIG. 1G, the level of the audio signals 100 is the same for each frequency band.

FIG. 1K shows examples of multiband limiter thresholds for each of a plurality of frequency bands. In this example, each of the thresholds is at or below the level of the input audio signals 100. The multiband limiter thresholds may, for example, correspond to the capabilities of a particular loudspeaker and may be implemented by or for that loudspeaker.

FIG. 1L is a graph that shows an example of the output of a timbre-preserving multiband limiter having the thresholds shown in FIG. 1K, when provided with the input audio signals 100 shown in FIG. 1J. In this example, the output for each frequency band does not correspond to the multiband limiter threshold for that frequency band. Instead, the timbre of the audio signals 100 is—preserved by constraining the output signal level of each frequency band to the minimum multiband limiter threshold. This example shows the extreme case of a multiband limiter that is 100% timbre preserving. In most implementations, timbre preservation is not this extreme. For example, some timbre preservation implementations may preserve the timbre in frequency bands of an upper frequency range, while allowing some bass frequency bands to be at least partially isolated. Alternatively, or additionally, some timbre-preserving methods may involve constraining the output signal level of a frequency band (at least to some degree) according to the output signal level and/or imposed thresholds of fewer than all other frequency bands.

Figure 1M:
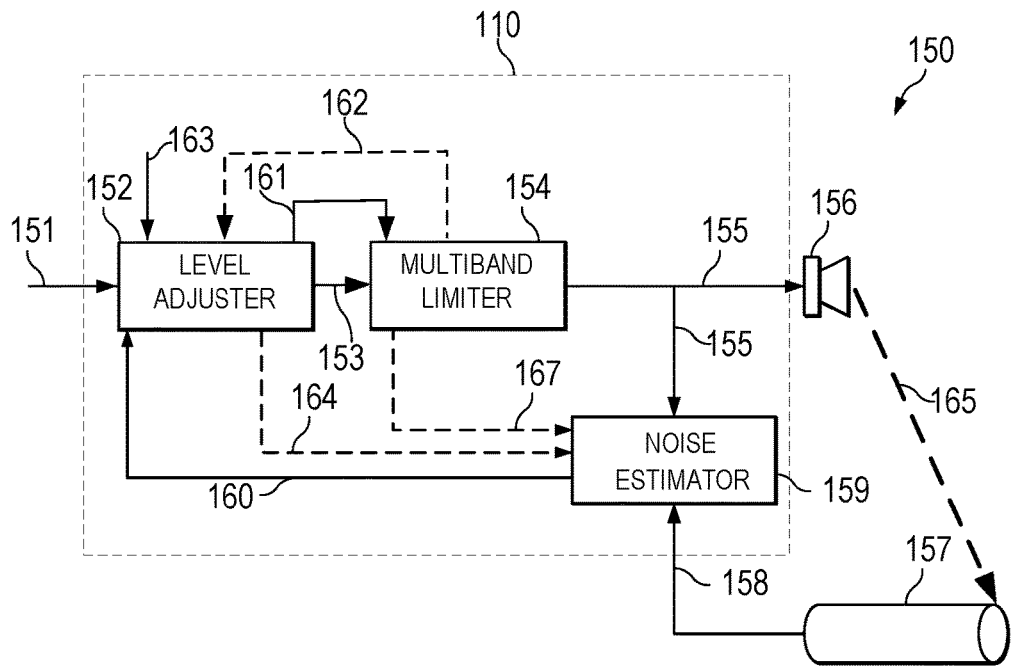
FIG. 1M shows an example of a noise compensation system.

FIG. 1M shows an example of a noise compensation system. In this example, the noise compensation system 150 includes a level adjuster 152, a multiband limiter 154, a loudspeaker 156, a microphone 157 and a noise estimator 159. According to this example (and the other examples of noise compensation systems disclosed herein, including but not limited to the examples shown in FIGS. 1N and 1O), the level adjuster 152, the multiband limiter 154 and the noise estimator 159 are implemented by a control system 110, which may be an instance of the control system 210 that is described below with reference to FIG. 2E. According to some examples, the microphone 157 may also be controlled by, and/or include part of, the control system 110. As noted elsewhere herein, the control system 110 may reside in a single device or in multiple devices, depending on the particular implementation. The level adjuster 152, the multiband limiter 154 and/or the noise estimator 159 may, in some examples, be implemented (at least in part) via software, e.g., according to instructions stored on one or more non-transitory media.

As with other figures of this disclosure, the types, numbers and arrangements of elements shown in FIG. 1M are merely examples. Other implementations may include more, fewer and/or different elements. For example, some implementations may include multiple audio reproduction transducers. Some implementations may include multiple microphones.

According to this implementation, the noise compensation system 150 includes a microphone 157 configured to detect sounds in an audio environment that includes the noise compensation system 150 and to provide corresponding microphone signals 158 to the noise estimator 159. The sounds may include sounds produced by the loudspeaker 156 and ambient noise (which may also be referred to herein as environmental noise or background noise) in the audio environment. As noted elsewhere in this document, the term "audio environment" is not intended to be limited to components of an audio system, such as audio reproduction transducers, amplifiers, etc. Instead, the term "audio environment" refers generally to an environment in which such components may reside and/or an environment in which one or more listeners may listen to played-back audio. The audio environment may, in some examples, be a home audio environment. In such instances, the audio environment may correspond with one or more rooms of a home. In other examples, the audio environment may be another type of environment, such as an office environment, an automobile environment, a train environment, a street or sidewalk environment, a park environment, etc.

In this example, the noise estimator 159 is configured to estimate the level of the background noise. According to this example, the noise estimator 159 is configured to implement an echo canceller, to reduce the likelihood that audio data reproduced by the loudspeaker 156 is part of the background noise estimate. In this example, the noise estimator 159 is configured to receive multiband limited audio data 155 that is output by the multiband limiter 154, which is also provided to the loudspeaker 156. The multiband limited audio data 155 is an example of what may be referred to herein as a "speaker reference," a "loudspeaker reference" or an "echo reference" for the echo canceller implemented by the noise estimator 159. Implementing an echo canceller in the noise estimator 159 can prevent a positive feedback loop based on sounds produced by the loudspeaker 156. In this example, the noise estimator 159 is configured to calculate a noise estimate of the ambient noise and to provide noise estimator output 160 to the level adjuster 152. In some examples, the noise estimator output 160 will include a spectral noise estimate. For example, the noise estimator output 160 may include a noise estimate for each frequency band of a plurality of frequency bands.

In this example, the level adjuster 152 is shown receiving input audio data 151. In some instances, the input audio data 151 may correspond to a content stream that includes video data. Here, the level adjuster 152 is configured to control (e.g., to raise, lower or maintain) the level of the input audio data 151. According to this example, the level adjuster 152 is configured to control the level of the input audio data 151 based, at least in part, on the level of noise that has been measured using the microphone 157. According to some examples, example, the level adjuster 152 is configured to control the level of the input audio data 151 based, at least in part, on the noise estimator output 160. Accordingly, the noise estimator output 160 is an example of what may be referred to herein as a "level adjustment indication." More specifically, the noise estimator output 160 is an example of what may be referred to herein as a "noise compensation level adjustment indication."

In this instance, the level adjuster 152 is shown receiving user input 163 corresponding to level adjustment, which is another example of what may be referred to herein as a level adjustment indication. More specifically, the user input 163 is an example of what may be referred to herein as a "user input level adjustment indication." It will be appreciated that the level adjuster 152 will not normally receive user input 163 continuously, but instead will usually receive user input 163 only intermittently, during times when a user seeks to adjust the audio playback level by providing input, e.g., via a voice command (e.g., a voice command received by the control system 110 via the microphone 157), via a manual remote control, etc. The level adjuster 152 (or another element of the control system 110) may, for example, store a value in a memory device corresponding to the most recent user input 163. In this example, the level adjuster 152 is configured to control a level of the input audio data 151 based on at least one type of level adjustment indication. Here, the level adjuster 152 is configured to provide level-adjusted audio data 153 to the multiband limiter 154.

According to some examples, the level adjuster 152 may be configured for determining a noise compensation method based, at least in part, on the state of the noise estimator 159 and/or user input 163. Accordingly, in some implementations the level adjuster 152 may be configured for determining a noise compensation method based, at least in part, on the noise estimator output 160 and/or user input 163.

In some examples, the noise estimator 159 may determine which noise compensation method should be implemented by the level adjuster 152. In some such examples, the noise estimator output 160 may indicate to the level adjuster 152 (e.g., via the noise estimator output 160 and/or via additional information) which noise compensation method should be implemented by the level adjuster 152.

In some implementations in which the noise estimator 159 is a multiple frequency band noise estimator, if the noise estimate has a set of non-updated frequency bands (e.g., in the upper frequency bands) that has not been updated for a threshold amount of time (e.g., on the order of seconds, such as 1 second, 2 seconds, 3 seconds, 4 seconds, 5 seconds, etc.), the noise estimator output 160 may indicate that the noise compensation method should switch to a timbre-preserving mode because the quality of the noise estimate in the non-updated frequency bands is low, although the quality of the noise estimate in the updated frequency bands may still be high. Alternatively, or additionally, in some implementations, the noise estimator may be configured to provide a quality metric or confidence score to the noise compensation block, which the noise compensation block may use to determine which mode to be in (or be partially in). For example, the noise compensation block may determine that the noise compensation method should be the timbre-preserving mode if the quality metric or confidence score indicates that the quality of the noise estimate is low.

In some implementations, the control system 110 (e.g., the noise estimator 159) may be configured to provide the multiple frequency band noise estimator functionality that is described in International Publication No. WO 2019/209973, filed on Apr. 24, 2019 and entitled "Background Noise Estimation Using Gap Confidence," particularly the discussion of gap confidence values and the use of gap confidence values on pages 16-18, which is hereby incorporated by reference.

According to some implementations, the frequency bands that are in a timbre preservation frequency range for the noise compensator, the multiband limiter, or both (e.g., the frequency range of the non-isolated frequency bands of FIG. 2B, which is described below) may be chosen according to a metric of quality for the noise estimate. The metric of quality for the noise estimate may, for example, correspond with the amount of time since a noise estimate for a frequency band has been updated.

In some examples, the gains that are applied (e.g., by the noise compensator) in one frequency band may be unconstrained with respect to the gains that are applied in another frequency band, e.g., relative to the gains that are applied in an adjacent frequency band. Therefore, the spectral content of the input audio signal will generally not be preserved according to this type of noise compensation method. Accordingly, this type of noise compensation method may be referred to herein as an "unconstrained" noise compensation method or a non-timbre-preserving noise compensation method.

According to some examples, the multiband limiter 154 may be configured to apply compression to the level-adjusted audio data 153 to prevent distortion in the loudspeaker 156 (and in some instances to other audio reproduction transducers of the audio environment), based at least in part upon a prior calibration or "tuning" of the multiband limiter 154. In some such examples, the multiband limited audio data 155 produces no distortion in the loudspeaker 156 so that the loudspeaker 156 operates in a linear range. The tuning may correspond to multiband limiter thresholds for each of a plurality of frequency bands. The multiband limiter thresholds may, for example, correspond to the capabilities (e.g., the distortion profile) of the loudspeaker 156 and may be implemented by or for that loudspeaker. In some examples, the multiband limiter thresholds may be pre-set at a factory at which the loudspeaker 156 is made.

However, in some examples the multiband limiter 154 may be configured to apply compression to the level-adjusted audio data 153 that allows at least some distortion in the loudspeaker 156 and/or one or more other audio reproduction transducers of the audio environment. In such examples, one or more audio reproduction transducers of the audio environment may be permitted to operate outside a linear range, at least temporarily. In some such examples, the control system may cause the one or more audio reproduction transducers of the audio environment to operate outside the linear range based, at least in part, on a noise compensation level adjustment indication and/or a noise estimate, e.g., on the noise estimator output 160 from the noise estimator 159. Some such examples also may involve causing a noise compensation module operation change when the multiband limited audio data 155 causes one or more audio reproduction transducers of the audio environment to operate outside a linear range. Some detailed examples are disclosed elsewhere in this document.

According to some implementations, the control system 110 (e.g., the level adjuster 152) may be configured for determining a multiband limiter configuration based, at least in part, on one or more types of received level adjustment indication. In some such examples, the multiband limiter configuration may be a timbre-preserving configuration if a user input level adjustment indication is received. Various examples of timbre-preserving configurations are disclosed herein. In some such examples, determining the multiband limiter configuration may involve changing a timbre-preserving functionality of the multiband limiter 154 if a noise compensation level adjustment indication is received.

In some such examples, the control system 110 (e.g., the level adjuster 152 or the multiband limiter 154 itself) may configure the multiband limiter 154 according to the determined multiband limiter configuration. In some implementations, the control system 110 (e.g., the level adjuster 152) may be configured to control the multiband limiter 154 and/or the noise estimator 159 based, at least in part, on the output level and/or the capabilities of the loudspeaker 156.

According to the example shown in FIG. 1M, the level adjuster 152 is configured to control the multiband limiter 154 via control signals 161. In some implementations, if the received level adjustment indication is a user input level adjustment indication, the timbre preservation settings of the multiband limiter 154 may be kept as the multiband limiter 154 was originally tuned, e.g., at a factory. Such implementations can help to ensure that the user has a pleasant experience when the user is adjusting a volume control.

According to some examples, if the received level adjustment indication is a noise compensation level adjustment indication, the timbre preservation settings of the multiband limiter 154 may be gradually turned off, e.g., in proportion to the noise compensation level adjustment indication. In some such examples, when noise is present the played-back audio content may still be intelligible over the noise with the loss of fidelity being masked by the noise source.

In some implementations, if the control system 110 (e.g., the level adjuster 152) is implementing a timbre-preserving noise compensation mode, the level adjuster 152 may inform the multiband limiter 154 (e.g., via the control signals 161), so that the multiband limiter 154 also operates in a timbre-preserving mode and does not allow overdriving of the loudspeaker 156. According to some examples, if the control system 110 is implementing an unconstrained noise compensation mode, the multiband limiter 154 also may operate in a relatively less constrained mode (e.g., as described below with reference to FIGS. 2A and 2B), in order to maximize volume (e.g., to overdrive the loudspeaker 156).

Conversely, if the multiband limiter 154 is limiting, in some implementations the control system 110 may cause the noise compensation mode to be an unconstrained noise compensation mode, even if the noise compensation mode was previously a timbre-preserving noise compensation mode, so that the volume can be maximized.

In the example shown in FIG. 1M, the multiband limiter 154 is configured to send optional compression feedback signals 162 to the level adjuster 152. The compression feedback signals 162 may, for example, indicate the amount of limiting the multiband limiter 154 is applying to the level-adjusted audio data 153. In some examples, the compression feedback signals 162 may indicate the amount of limiting that the multiband limiter 154 is applying to each of a plurality of frequency bands of the level-adjusted audio data 153.

Figure 1N:
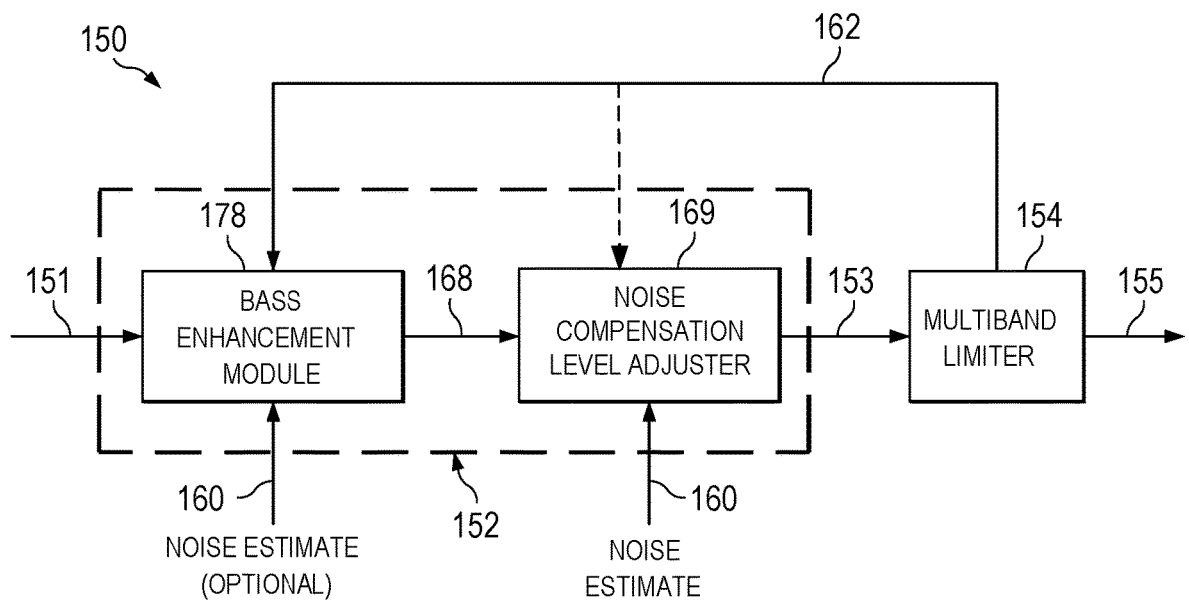
FIG. 1N shows a portion of a noise compensation system that includes an example of a level adjuster that is configured for modifying level-adjusted audio data according to compression feedback signals from a multiband limiter.

FIG. 1N shows a portion of a noise compensation system that includes an example of a level adjuster that is configured for modifying level-adjusted audio data according to compression feedback signals from a multiband limiter. In this example, the level adjuster 152 includes a bass enhancement module 167 and a noise compensation level adjuster 169. FIG. 1N also indicates the multichannel stream 168 that has been processed by the bass enhancement module 167 and which, in this example, is provided to the noise compensation level adjuster 169. According to some examples, the bass enhancement module 167 is configured to spread the bass from one loudspeaker to one or more other loudspeakers. In some examples, the bass enhancement module 167 is configured to determine how much the input bass should be spread to other speakers based, at least in part, on the compression feedback signals 162.

In some implementations, the bass enhancement module 167 is configured to implement a psychoacoustic bass enhancement (e.g., a virtual bass exploiting the missing fundamental phenomena, e.g., as described below with reference to FIG. 1O). According to some examples, the bass enhancement module 167 may be configured to determine how much virtual bass should be implemented based, at least in part, on the compression feedback signals 162.

In some implementations, the bass enhancement module 167 is configured to receive a noise estimate 160. The bass enhancement module 167 may, for example, use noise estimate 160 to control the aggressiveness of the bass spreading and/or the virtual bass. In some such examples, if the noise level is high the bass enhancement module 167 will be relatively more aggressive in spreading the audio even to the extent where it is no longer just the bass frequencies that are being spread, but potentially most or all of the spectrum audible to humans (for example, the bass enhancement module 167 may spread higher frequencies than bass frequencies to all loudspeakers) than if the volume limiting were due to user input. Further examples of "aggressiveness" are provided below. According to some implementations, the bass enhancement module 167 may also start introducing virtual bass processing earlier than would have been the case if the volume limiting were entirely due to a user volume control.

FIG. 1O shows a more detailed version of FIG. 1N, according to one example. As with other figures of this disclosure, the types, numbers and arrangements of elements shown in FIG. 1O are merely examples. Other implementations may include more, fewer and/or different elements. In some alternative examples, the processing flow may be different from that shown in FIG. 1O, e.g., if the noise compensation were used for controlling the bass enhancement.

In the example shown in FIG. 1O, the level adjuster 152 includes examples of the bass enhancement module 178 and the noise compensation level adjuster 169. As noted elsewhere herein, according to some examples the level adjuster 152 may be configured for determining a noise compensation method based, at least in part, on the state of the noise estimator 159 and/or user input 163. Accordingly, in some implementations the noise compensation level adjuster 169 may be configured for determining a noise compensation method based, at least in part, on the noise estimator output 160 and/or user input 163. Some such examples are described above with reference to FIG. 1M. Additional examples are disclosed in FIGS. 7 and 17 and the corresponding descriptions of U.S. Pat. No. 8,090,120 (column 18, line 29 through column 26, line 46 and column 34, line 41 through column 35, line 11), which are hereby incorporated by reference.

According to the example shown in FIG. 1O, the input audio data 151 is shown as two input channels (e.g., stereo channels) CH1 and CH2. In FIG. 1O, the noise estimate 160 (which may be provided by the noise estimator 159 of FIG. 1M) is provided to the noise compensation level adjuster 169. In this example, the compression feedback signals 162 provided to the level adjuster 152 indicate the amount of limiting that is occurring in the multiband limiter 154. According to some examples, the compression feedback signals 162 are optionally provided to both the bass enhancement module 178 and the noise compensation level adjuster 169. According to some such examples, the compression feedback signals 162 may be provided to the virtual bass (VB) blocks 171. If the compression feedback signals 162 are provided to the noise compensation level adjuster 169, in some examples the compression feedback signals 162 may be used to modify the overall predicted output level used within the noise compensation level adjuster 169.

In some examples, the noise compensation level adjuster 169 optionally implement a psychoacoustic volume control. According to some such examples, rather than applying a wideband gain that results in a change of gain by the same amount across all frequency bands, which may cause a change in the perceived spectrum, a specific loudness scaling factor may associated with the volume control adjustment. In some such examples, the gain in each of multiple frequency bands is changed by an amount that takes into account a human hearing model so that, ideally, there is no change in the perceived spectrum. Some relevant examples are disclosed in the "Time-Invariant and Frequency-Invariant Function Suitable for Volume Control" section of U.S. Pat. No. 8,090,120 (column 26, line 48 through column 28, line 13), which is hereby incorporated by reference.

Some psychoacoustic volume control implementations may involve a mapping between the digital/electrical domain into the acoustic domain (e.g., between decibels relative to full scale (dBFS) and decibels of sound pressure level (dBSPL), taking into account the amount of gain, etc., within the downstream processing components. In some such examples a psychoacoustic volume control may be calibrated in the region of the system where the multiband limiter 154 is not active. This means that the digital to sound pressure level (SPL) mapping will often be incorrect when the multiband limiter 154 is active (because it is generally a fixed mapping). By indicating to the level adjuster 152 (e.g., to the noise compensation level adjuster 169) that the multiband limiter 154 is limiting, the digital to SPL mapping can be corrected and therefore the amount of noise compensation required will not be underestimated.

The arrangement of blocks and sequence of operations shown in FIG. 1O are due to the fact that, according to some examples in which the noise compensation level adjuster 169 implements a psychoacoustic volume control, the noise compensation level adjuster 169 may incorporate the loudness curves of a psychoacoustic bass enhancement for controlling volume level relative to the noise estimate. Therefore, having the noise compensation block audio processing after the bass enhancement block audio processing requires less conversion from the acoustic domain to the digital domain, the latter of which is the domain in which a psychoacoustic system will operate according to this example.

Furthermore, in some systems in which the noise compensation level adjuster 169 runs out of gain headroom, the other blocks of the level adjuster 152 (such as blocks 167 and/or 171) may be instructed by the noise compensation level adjuster 169 to increase the amount of processing that they perform to ensure the noise compensation system 150 can reach its peak loudness. The noise compensation level adjuster 169 running out of headroom may be indicated by the multiband limiter 154 limiting and providing compression feedback signals 162 to the noise compensation level adjuster 169. The noise compensation level adjuster 169 may, in some cases, run out of headroom by compensating in response to a high level of noise. Furthermore, in some implementations in which the noise compensation level adjuster 169 is controlling the other blocks of the level adjuster 152, the noise compensation level adjuster 169 may send a signal 161 to the multiband limiter 154 indicating that the multiband limiter 154 should stop acting in a timbre-preserving mode and/or allow the overdriving of one or more loudspeakers.

According to this example, the bass enhancement module 178 includes bass extraction modules 177, mixers 172 and 179, and virtual bass (VB) blocks 171. In this example, the VB blocks 171 provide output 168 to the noise compensation level adjuster 169. In some examples, each of the bass extraction modules 177 may be implemented as a set of dynamic crossover filters that can be controlled at runtime. In some such examples, when the multiband limiter 154 is limiting in the low frequency bands, the bass (e.g., the corresponding low frequency bands) may be extracted.

According to some such implementations, the bass extraction modules 177 may be configured to extract (from input channels CH1 and CH2) high frequency content (high pass filtered signals 175) in a high frequency range above the crossover frequency, and low frequency content (the bass extracted audio 173) in a low frequency range below the crossover frequency. In some examples, the bass extraction modules 177 may be configured to control the crossover frequency based, at least in part, upon the compression feedback signals 162. The crossover frequency may be controlled by the amount of limiting (as indicated by the compression feedback signals 162) that is being performed in multiband limiter 154. In some examples, the limiting may be only in a low range of frequencies, for example up to 500 Hz, but in alternative examples the limiting may be in a wider or full range of frequencies. In some examples, the compression feedback signals 162 may indicate (and the crossover frequency may be determined by) an amount of compression applied by multiband limiter 154 in each of at least two low frequency bands of a low range of frequencies (e.g., up to 500 Hz). Alternatively, the compression feedback signals 162 may indicate (and the crossover frequency may be determined by) an amount of compression applied by multiband limiter 154 in frequency bands in a wider or full range of frequencies.

In this example, the bass extracted audio 173 from both input channels CH1 and CH2 has been low pass filtered and provided to the mixer 172, which downmixes the bass extracted audio 173 into a single channel. According to this example, the mixer 172 provides the downmixed bass 174 that is to be spread to both channels (in other words, mixed back into both channels) to the mixers 179. In this example, the mixers 179 mix the downmixed bass 174 and the high pass filtered signals 175 that are not bass extracted, and output the modified channels 170. According to some examples, the modified channels 170 have had the bass spread across both channels based upon the multiband limiter behavior and the noise estimate 160 (and/or based on the proportion of gain corresponding to user input 163 as compared to the gain based upon noise compensation control).

In this example, the noise estimate 160 is optionally provided to the bass extraction modules 177 and the VB blocks 171. In this implementation the bass enhancement module 178 also takes into account the noise estimate 160 (and/or the proportion of the system volume that has been controlled by the noise compensation level adjuster 169 as compared to the volume corresponding to user control). According to some examples, if the noise estimate 160 is high then the frequencies that will be extracted will generally consist of more of the spectrum than if the noise estimate is low. According to some such examples, the bass enhancement module 178 may be configured to adjust, based upon the noise estimate 160, what may be referred to herein as the "aggressiveness" of the frequency extraction. As used herein, the term "aggressiveness" is a parameter that refers to the degree of bass volume enhancement.

In some such examples, the bass extraction modules 177 may be configured to determine the crossover frequency ("targeted_crossover" in the formulas below) in accordance with the following formulas:

$$\text{targeted\_crossover} = \text{total\_gain\_ratio} * \text{max\_freq\_limiting} * \text{aggressiveness} \quad \text{(Equation 1)}$$

In Equation 1, "aggressiveness" represents a parameter indicative of aggressiveness of bass volume enhancement. In some examples, the "aggressiveness" parameter may be tuned by ear, e.g., by a user or by a provider of a noise compensation system, to ensure that the system does not include too much or too little energy in the downmixed bass 174. According to some examples, a linear interpolation of the "aggressiveness" parameter may be used to fade between two "aggressiveness" settings (e.g., one high volume setting due to noise and another high volume setting due to user input).

In Equation 1, "max_freq_limiting" represents the maximum frequency covered by a band that is being limited in the multiband limiter 154. In some examples, "max_freq_limiting" may be determined by, or derived directly from, the highest frequency of the highest-frequency band that is being limited by the multiband limiter 154. In some implementations, "max_freq_limiting" may be clipped to the range that the bass extraction modules 177 support.

In some examples, $$\text{"total\_gain\_ratio"} = \text{total\_gain} / \text{max\_possible\_gain} \quad \text{(Equation 2)}$$

In Equation 2, "max_possible_gain" represents the sum of the maximum gains of every band that is being limited (at the time) by the multiband limiter 154 for all bands that may be bass extracted by the bass extraction modules 177 (or all bands that may be limited in the multiband limiter 154, in some embodiments). In some examples, "max_possible_gain" may be the sum of the maximum gains that may be applied by the multiband limiter 154 for all bands that may be bass extracted, in the sense that "max_possible- _gain" may be the maximum integral of all the gains that may be applied by the multiband limiter 154 for the bins having frequencies that do not exceed a maximum crossover frequency.

In Equation 2, "total_gain" represents the sum of all gains being applied (e.g., as indicated by the compression feedback signals 162 for each frequency band) to all bands that may be bass extracted (or all bands that may be limited, in some embodiments).

In Equations 1 and 2, the "total_gain_ratio" represents an indicator of how much the multiband limiter 154 is limiting overall within all the bands that may be bass extracted by the bass extraction modules 177. In Equation 2, the "total_gain_ratio" is normalized (by the "max_possible_gain" parameter) so that "total_gain_ratio" gives a better indication of the overall amount of limiting that is occurring for a variable number of bands.

In some implementations, the crossover frequency ("targeted_crossover" in Equation 1) for each of filters 205 and 206 may be increased, to increase the amount of bass enhancement applied, when the multiband limiter 154 is applying more limiting (e.g., when "total_gain_ratio" in Equations 1 and 2 is increased). In some implementations, the crossover frequency may be decreased, to decrease the amount of bass enhancement applied, when the multiband limiter 154 is applying less limiting (e.g., when "total_gain_ratio" in Equations 1 and 2 is decreased). The crossover frequency (e.g., "targeted_crossover" in Equations 1 and 2) may, in some examples, be smoothed out with an attack and release to ensure the user does not notice sudden jumps in the panning According to this example, the VB modules 171 create a bass perception based upon a missing fundamental phenomenon. According to some examples, the VB modules 171 may configured create a perception of increased bass by injecting signals that are at the harmonics of a bass frequency within that of an input signal. In some such examples, the number of harmonics that are injected and the amplitudes of the harmonics may be determined by both the corresponding compression feedback signals 162 and by the noise estimate 160 (or the proportion of the volume controlled by the noise compensation level adjuster 169 as compared to the volume corresponding to user input). If the noise estimate 160 is high, in some examples then the amount of virtual bass (e.g., the number of harmonics and their amplitude) will be increased when compared to the case where the noise estimate is low (e.g., by adjusting the aggressiveness of Equations 1 and 2). In some implementations, the amount of virtual bass may be determined as follows:

$$\text{virtual\_bass\_gains} = \text{min\_virtual\_bass\_gain} + ((1+0.01 \times A)^{-\text{limiter\_gain}} - 1) \quad \text{(Equation 3)}$$

In Equation 3, "limiter_gain" represents a multiband limiter gain value for the lowest frequency band, which the multiband limiter 154 may provide to one or both of the VB modules 171. In Equation 3, "A" represents a parameter indicating aggressiveness of virtual bass application (e.g., how much virtual bass is applied per amount of multiband limiter gain). In one example A=-25, but A may be higher or lower in alternative examples. In Equation 3, "min_virtual_bass_gain" represents the minimum amount of virtual bass gain applicable. According to some examples, a linear interpolation of the "aggressiveness" parameter may be used to fade between two "aggressiveness" settings (e.g., one high volume setting due to noise and another high volume setting due to user input).

Returning to the example shown in FIG. 1M, in this implementation the level adjuster 152 is configured to send optional control signals 164 to the noise estimator 159. In some implementations, the multiband limiter 154 may be configured to send optional control signals 167 to the noise estimator 159. As described in more detail elsewhere herein, in some instances the level adjuster 152 may configure the multiband limiter 154 to allow some distortion (e.g., in order to increase the playback volume in the presence of ambient noise), causing one or more audio reproduction transducers of the audio environment to operate outside a linear range. In such instances, the audio path 165 from the loudspeaker 156 to the microphone 157 may include at least some sounds corresponding to non-linear distortion of the loudspeaker 156. At least in part because echo cancellers are generally based on linear algorithms, the echo canceller will not be able to properly cancel out the sounds corresponding to non-linear distortion of the loudspeaker 156.

Therefore, according to some such examples, if the level adjuster 152 configures the multiband limiter 154 to cause one or more audio reproduction transducers of the audio environment to operate outside a linear range, the level adjuster 152 also may send control signals 164 (or the multiband limiter 154 also may send control signals 167) to the noise estimator 159 indicating that the noise estimator 159 should change an operational mode. In some such examples, the control signals 164 (or the control signals 167) may indicate that an echo canceller implemented by the noise estimator 159 should use only quiet playback intervals of the multiband limited audio data 155 as input. In some such examples, the quiet playback intervals may be instances of audio signals at or below a threshold level in one or more frequency bands. Alternatively, or additionally, in some examples the quiet playback intervals may be instances of audio signals at or below a threshold level during a time interval. Quiet playback intervals also may be referred to herein as "gaps."

In some implementations, if the level adjuster 152 configures the multiband limiter 154 to cause one or more audio reproduction transducers of the audio environment to operate outside a linear range, the control signals 164 (or the control signals 167) may indicate that one or more functions of the echo canceller should be disabled or paused. For example, the echo canceller may normally operate by updating coefficients of adaptive filters for each of a plurality of frequency bands. In some such implementations, the control signals 164 (or the control signals 167) may control the acoustic echo canceller to not update the filter coefficients if the multiband limited audio data 155 would cause the loudspeaker 156 (or one or more other audio reproduction transducers of the audio environment) to operate outside a linear range.

Figure 2A:
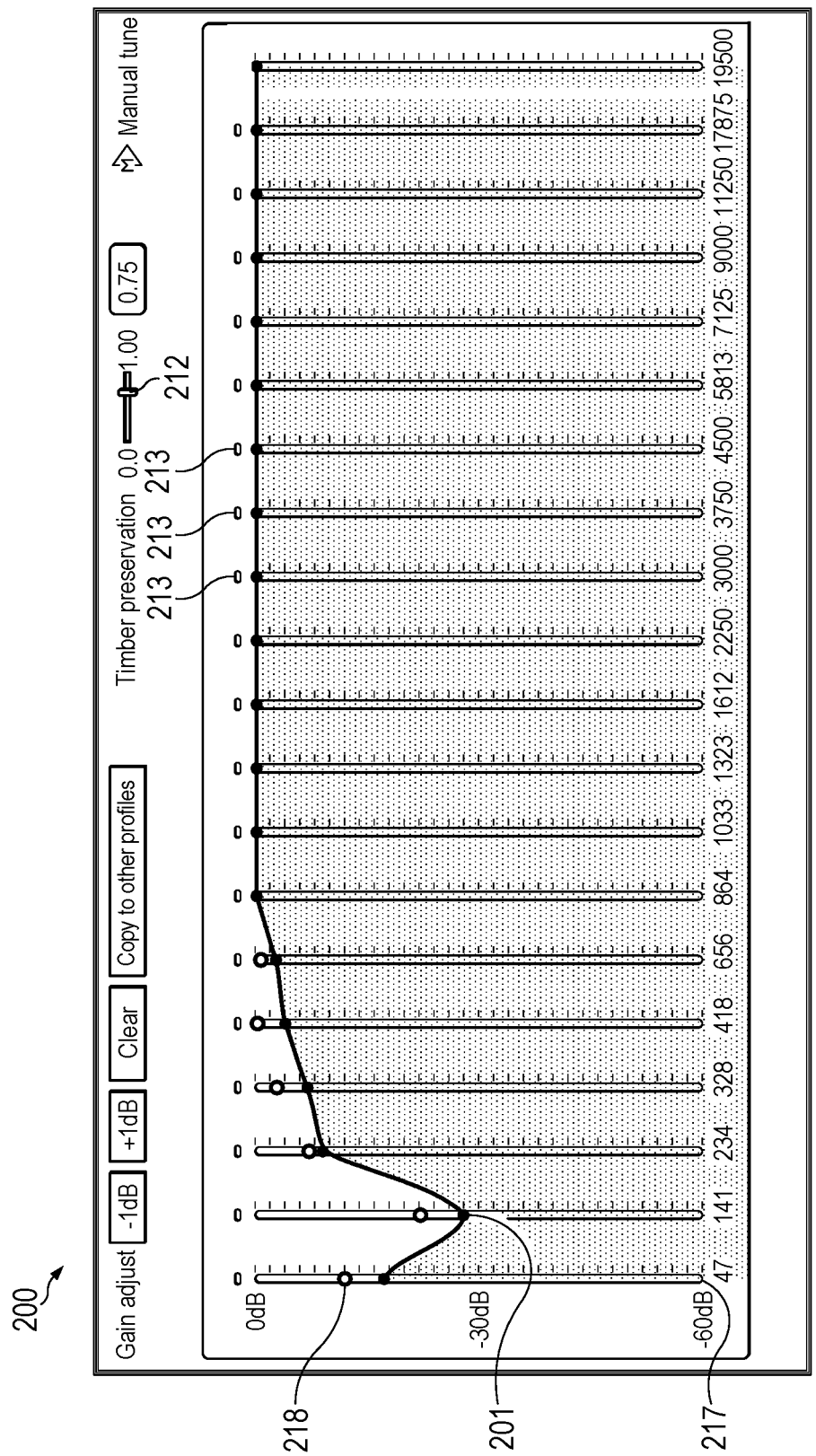
FIG. 2A shows an example of a graphical user interface (GUI) for setting thresholds and other parameters for a multiband limiter.

FIG. 2A shows an example of a graphical user interface (GUI) for setting thresholds and other parameters for a multiband limiter. The GUI 200 may, for example, be presented on a display device according to software executed by a control system. A user may interact with the GUI 200 by providing user input, e.g., via a touch screen on the display on which the GUI 200 is being presented, via a mouse, via a keyboard, via voice commands, etc. As with other drawings presented herein, the types and numbers of elements, as well as the particular values indicated, are merely shown by way of example.

In this implementation, the y axis indicates decibels ranging from 0 dB to −60 dB and the x axis indicates frequencies in Hz. In this example, the GUI 200 shows a set of example thresholds 201 for each of a plurality of frequency bands 217. According to this example, each threshold 201 is illustrated by a dot in the vertical line representing the corresponding frequency band 217. The center frequency of each of the frequency bands 217 is indicated adjacent to the vertical line representing the frequency band 217. In some implementations, the thresholds 201 are levels that a signal is not allowed to exceed in the corresponding frequency band. If the input level exceeds a threshold 201, a negative gain may be applied that limits the level to the threshold 201.

The levels of the thresholds 201 may be related to the maximum input value that still has a linear output response in the corresponding frequency band when reproduced by an audio reproduction transducer. For example, the particular thresholds 201 that are shown in FIG. 2A may be pre-set according to the capabilities of a particular audio reproduction transducer. In this example, the thresholds 201 are generally lower in the lowest-frequency bands. This indicates that a particular audio reproduction transducer distorts at a lower level at low frequencies than at high frequencies. In this example the frequencies above 844 Hz are not limited at the maximum volume for that particular device.

According to this example, elements 213 indicate an isolation setting for a particular frequency band. If a frequency band is set to be isolated, then only the audio in that frequency band has an effect on the limiting gain that is applied. In the example shown in FIG. 2A, none of the frequency bands are isolated.

Figure 2B:
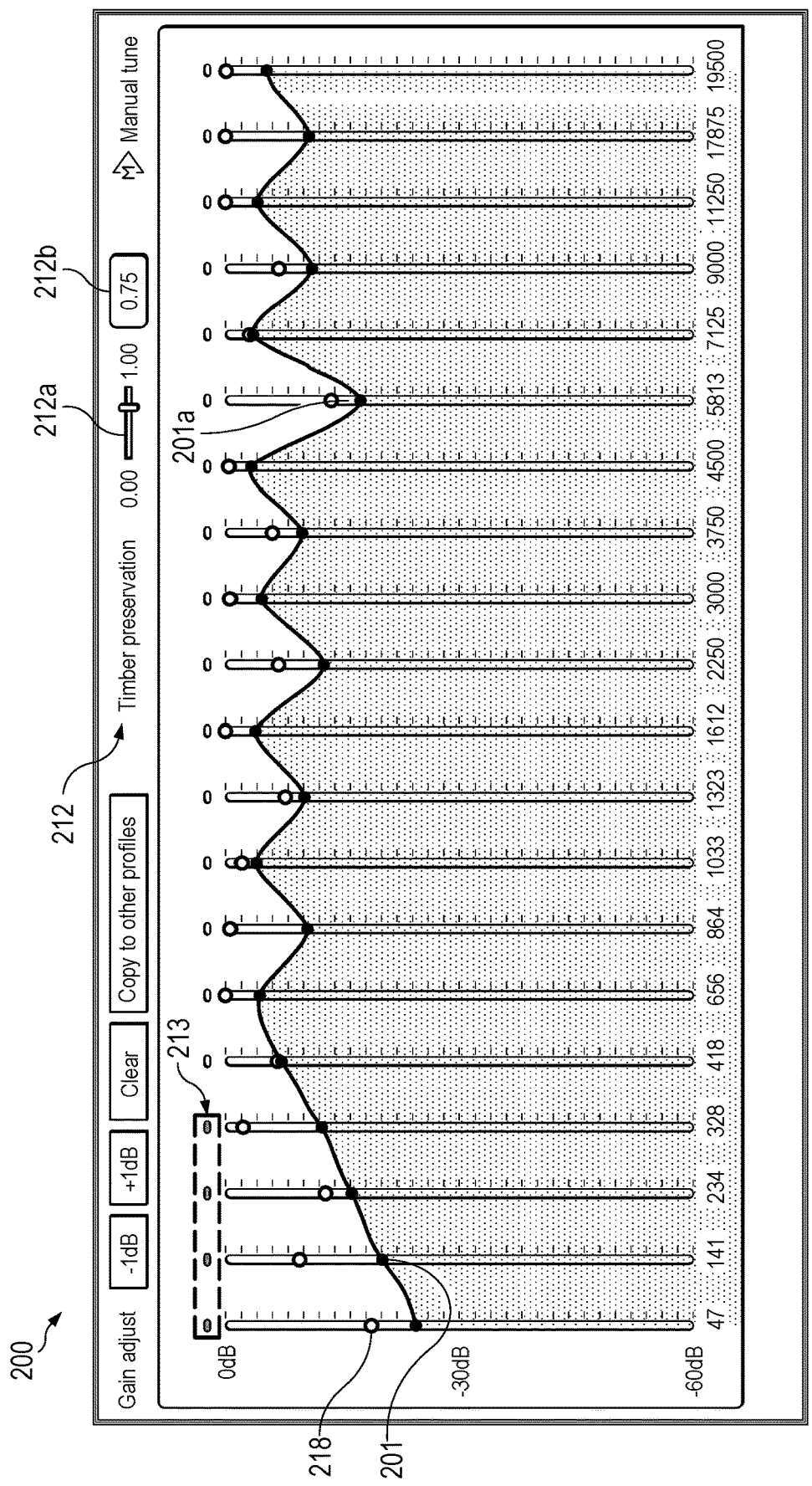
FIG. 2B shows another example of thresholds and other parameters for a multiband limiter.

FIG. 2B shows another example of thresholds and other parameters for a multiband limiter. FIG. 2B shows an example of the GUI 200 in which four elements 213 indicate that four corresponding bass frequency bands are isolated. In some cases it may be desirable to allow particular frequency bands, such as bass frequency bands, to operate in complete isolation, with no contribution to timbre preservation. For example, some audio systems can have extremely low fixed thresholds in bass frequencies due to a small speaker size. If these bass frequency bands are allowed to contribute to a timbre preservation calculation, a drastic reduction of the overall playback level can result. In such a case, it can be desirable to allow these bass frequency bands operate independently, as depicted in FIG. 2B, and to apply a timbre preservation method to the remaining frequency bands.

In some alternative implementations, instead of being entirely isolated or entirely not isolated, a frequency band may be partially isolated (e.g., 25% isolated, 50% isolated, 75% isolated, etc.). In some such examples, the degree to which a frequency band is isolated may be selectable via an alternative version of the GUI 200 that includes a slider or other virtual user input device corresponding to one or more of (e.g., each of) the elements 213. In other examples, the degree to which a frequency band is isolated may be automatically changed due to changing conditions, such as a change in the level of ambient noise in the audio environment. Some examples are described below with reference to FIG. 4C.

In the examples shown in FIGS. 2A and 2B, the dots 218 in some frequency bands indicate example tunings for what may be referred to herein as "overdrive" or as operation outside of an audio reproduction transducer's linear range. Various examples are disclosed herein. Between the dots 201 and the dots 218, the audio reproduction transducer will not be operating in the linear range. According to some examples, the dots 218 represent a hard limit beyond which the audio reproduction transducer will not be driven. In some alternative implementations, the dots 218 represent a soft limit beyond which the audio reproduction transducer may, in some circumstances, be driven. In some implementations such explicit overdrive tunings may be optional and in some alternative examples such explicit overdrive tunings may not exist. In some implementations an explicit overdrive tuning may be a fixed value across all bands (e.g. 3 dB added to the thresholds 201).

In the examples shown in FIGS. 2A and 2B, the element 212 allows a user (e.g., an employee of a device manufacturer) to select a timbre preservation setting. In these examples, a user may interact with the element 212 by moving the slider portion 212a and/or by inputting a numerical value in the window portion 212b. In some implementations, the timbre preservation setting corresponds to the amount that a signal in one frequency band can affect the gain that is applied to other frequency bands, e.g., to one or more neighboring frequency bands, if the frequency bands are not isolated.

In some implementations, the timbre preservation setting 1.00 may correspond to time-varying thresholds $T_b[n]$ computed as a function of all frequency band signals $x_b[n]$ and all fixed thresholds $L_b$ across all non-isolated frequency bands b=1 . . . B:

$$T_b[n] = \text{TPF}(\{x_i[n], L_i | i=1 \ldots B\})$$

The fixed thresholds $L_b$ may, for example, correspond to the thresholds 201. The gains, $g_b[n]$, for each frequency band may then be computed as $g_b[n] = \text{CF}(x_b[n], T_b[n])$.

For timbre preservation settings less than 1.00, each threshold $T_b[n]$ may be computed as a function of a plurality, but less than all, frequency band signals $x_b[n]$ and/or a plurality, but less than all, of fixed thresholds $L_b$ of the non-isolated frequency bands. For example, in a timbre preservation setting of 0.50, each threshold $T_b[n]$ may be computed as a function of half of the frequency band signals $x_b[n]$ and fixed thresholds $L_b$ of the non-isolated frequency bands.

In some examples, a time-varying threshold for a frequency band can be computed based on its nearest neighbor non-isolated frequency bands or a range of neighboring non-isolated frequency bands.

In some examples, if a non-isolated frequency band receives significant gain reduction due to being above its fixed threshold, then the time-varying thresholds of other non-isolated frequency bands may also be decreased to receive some gain reduction. Since the time-varying threshold for the frequency band is decreased below its respective fixed threshold, the multiband limiter 154 still reduces distortion while alteration to the timbre may be mitigated or otherwise prevented.

In some examples, a control system (e.g., the multiband limiter 154) may be configured to compute an average difference of the audio input signal in each frequency band and its respective fixed threshold, $L_b$. The time-varying threshold in each frequency band can then be the audio input signal level in such band minus this average difference.

Alternatively, or additionally, time-varying thresholds may be smoothed over time, at least more so than gains $g_b[n]$. That is to say, the levels of audio input signal used for computing thresholds can be smoothed more heavily than the signals (e.g., $e_b[n]$) used for computing the gains $g_b[n]$. In one such example, a one pole smoother with longer time constants can be employed to compute a smoother energy signal $s_b[n]$:

$$s_b[n] = \begin{cases} \alpha_A s_b[n-1] + (1-\alpha_A) x_b^2[n], & x_b^2[n] \geq s_b[n-1] \\ \alpha_R s_b[n-1] + (1-\alpha_R) x_b^2[n], & \text{otherwise} \end{cases}$$

In this case, attack and release times on the order of 10 times more than a conventional multi-band limiter can be used. The smooth energy signal may then be represented in dB as follows:

$$S_b[n] = 10\log_{10}(s_b[n])$$

The difference between the smooth energy signal in each frequency band and the fixed threshold $L_b$ in each frequency band, also represented in dB, may be computed as:

$$D_b[n] = S_b[n] - L_b$$

and the minimum of these distances over all frequency bands may be found:

$$D_{min}[n] = \min_b\{D_b[n]\}$$

A weighted average of these differences across frequency bands may then be computed as follows, where $\beta$ represents the weighting factor:

$$D_{avg}[n] = \left(\frac{\sum_{b=1}^{B}(D_b[n] - D_{min}[n])^\beta}{B}\right)^{\frac{1}{\beta}} + D_{min}[n]$$

When $\beta=1$, the true average of the differences is computed, and when $\beta>1$ the larger differences contribute more heavily to the average. In other words, frequency bands having energy farther above threshold $L_b$ contribute more. In some examples, $\beta=8$ has been found to yield an adequate weighting. Finally, the threshold $T_b[n]$ may be computed as the smooth signal energy in a frequency band minus an average difference when this threshold is less than the fixed threshold $L_b$. Otherwise, according to some implementations, the time-varying threshold may be kept equal to the fixed threshold, e.g., as follows:

$$T_b[n] = \begin{cases} S_b[n] - D_{avg}[n], & S_b[n] - D_{avg}[n] < L_b \\ L_b & \text{otherwise} \end{cases}$$

In some alternative implementations, rather than a weighted average, a threshold from a maximum of the distances $D_b[n]$ may be computed:

$$D_{max}[n] = \max_b\{D_b[n]\}$$

Each threshold may then be computed as the smooth signal energy in the frequency band minus the maximum distance plus some tolerance value $D_{tol}$, if this threshold is less than the fixed threshold:

$$T_b[n] = \begin{cases} S_b[n] - D_{max}[n] + D_{tol}, & S_b[n] - D_{max}[n] + D_{tol} < L_b \\ L_b & \text{otherwise} \end{cases}$$

The tolerance value $D_{tol}$ may, for example, be designed to allow some variation in the amount of compression applied to each frequency band. In one specific embodiment, a practical value of $D_{tol}=12$ dB has been found to allow sufficient variation.

In the example shown in FIG. 2B, the threshold 201a is the lowest threshold for frequency bands that are not isolated. In some such examples, if 100% timbral preservation were selected via the element 212, no other non-isolated frequency band would be able to exceed that threshold.

Figure 2C:
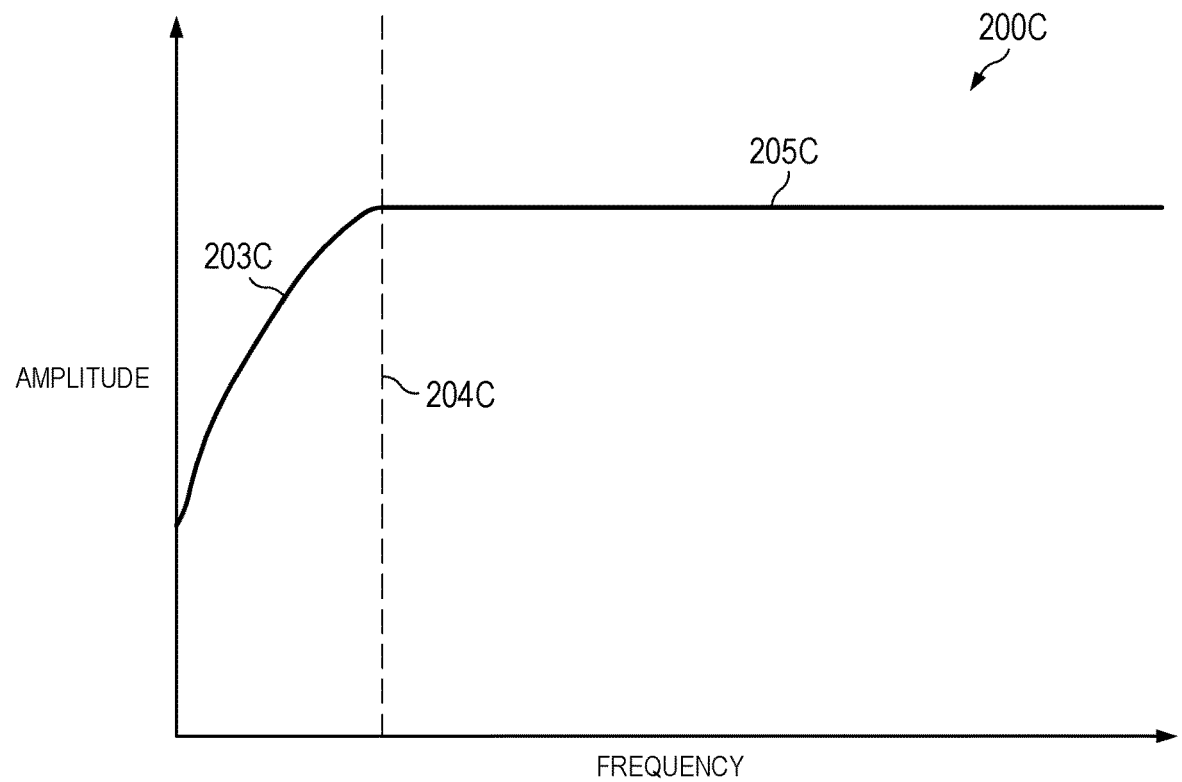
FIG. 2C is a graph that shows an example of thresholds for a range of frequencies.

FIG. 2C is a graph that shows an example of thresholds for a range of frequencies. In graph 200C of FIG. 2C, the vertical axis represents amplitude and the horizontal axis represents frequency. The thresholds for each frequency shown in graph 200C are represented by line segments 203C and 205C. Line segment 203C represents thresholds for isolated frequency bands in the bass range. Line segment 203C is intended to roughly correspond to the thresholds shown in FIG. 2B for of the four isolated frequency bands in the bass range.

Line segment 205C represents the excitations of the higher-frequency bands of FIG. 2B (those above the four isolated frequency bands in the bass range) to which a timbre preservation method has been applied. Here, the dashed line 204C indicates a border between independent frequency bands and timbre-preserving frequency bands. In some examples, there may be more than one border between independent or isolated frequency bands and timbre-preserving frequency bands.

In this example, it can be seen that although the thresholds of the higher-frequency bands of FIG. 2B are different, the output of the timbre preservation method has limited the excitations of all frequencies represented by the line segment 205C to the lowest threshold of the higher-frequency bands of FIG. 2B, which is the threshold 201a of FIG. 2B.

In the example of graph 200C, a control system (e.g., a control system that is implementing the level adjuster 152 of FIG. 1M) has determined a multiband limiter configuration in response to a user input level adjustment indication received via user input. For example, a user may have used a remote control device to adjust the volume. According to this implementation, determining the multiband limiter configuration involves determining a timbre-preserving configuration, because at least one type of received level adjustment indication was a user input level adjustment indication. In this example, as in the examples shown in FIGS. 1G and 1J, the input audio corresponds to white noise that is at a level that causes limiting in the multiband limiter. In the examples shown in FIGS. 2C and 2D, a level adjuster has adjusted the input audio to this level based on one or more level adjustment indications, which may have been received via user input or via input from a noise estimator. It can be seen that the timbre is fully preserved in the outputted excitation for the frequency bands corresponding to the line segment 205C.

Figure 2D:
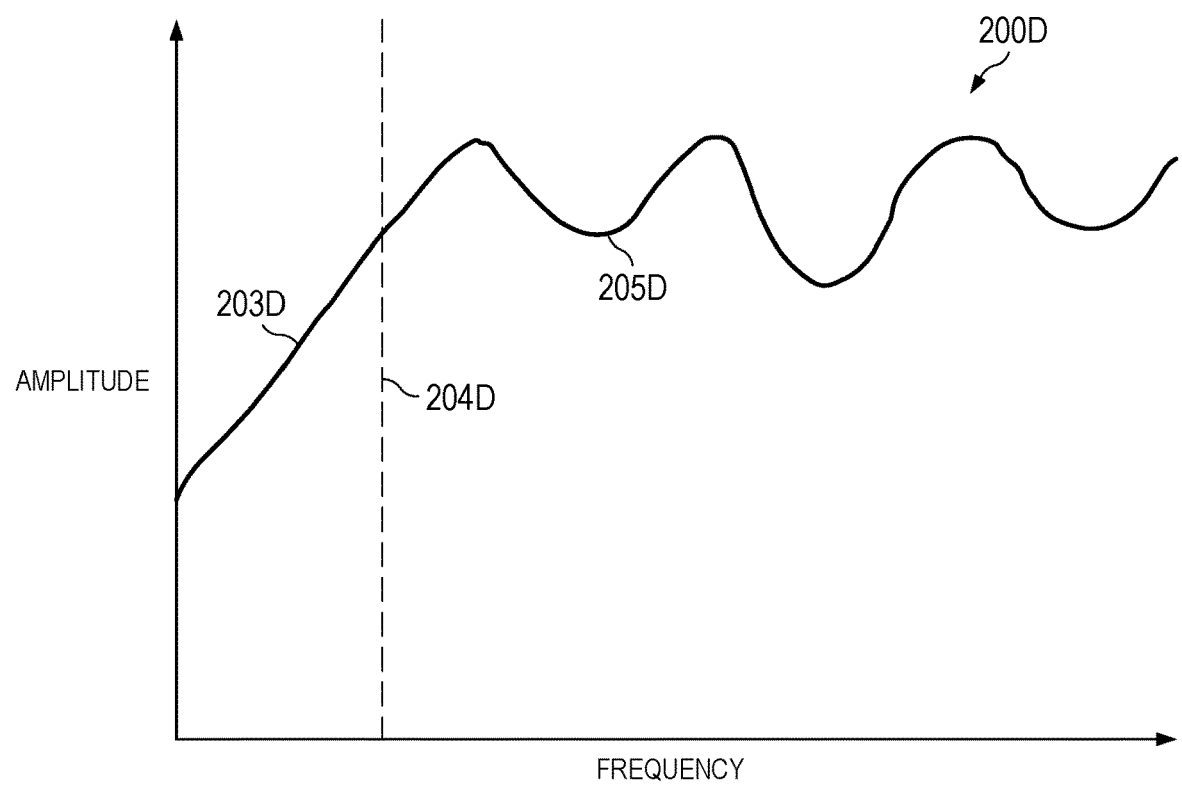
FIG. 2D is a graph that shows another example of thresholds for a range of frequencies.

FIG. 2D is a graph that shows another example of thresholds for a range of frequencies. In graph 200D of FIG. 2D, the vertical axis represents amplitude and the horizontal axis represents frequency. The thresholds for each frequency shown in graph 200D are represented by line segments 203D and 205D. Line segment 203D represents thresholds for isolated frequency bands in the bass range. Line segment 203D is intended to roughly correspond to the thresholds shown in FIG. 2B for of the four isolated frequency bands in the bass range. In this example, the line segment 203D is intended to be the same as the line segment 203C of FIG. 2C.

In this example, the line segment 205D represents the excitations of the higher-frequency bands of FIG. 2B (those above the four isolated frequency bands in the bass range) to which a timbre preservation method would normally be applied. Here, the dashed line 204D indicates a border between independent frequency bands and frequency bands to which a timbre preservation method would normally be applied. In some examples, there may be more than one border between independent frequency bands and frequency bands to which a timbre preservation method would normally be applied.

In the example of graph 200D, a control system (e.g., a control system that is implementing the level adjuster 152 of FIG. 1M) has determined a multiband limiter configuration in response to a noise compensation level adjustment indication received from a noise compensation module (e.g., from the noise estimator 159 of FIG. 1M). According to this example, determining the multiband limiter configuration involves changing a timbre-preserving functionality, because at least one type of received level adjustment indication was a noise compensation level adjustment indication. In this implementation, changing the timbre-preserving functionality involves at least partially disabling the timbre-preserving functionality.

According to this example, the noise compensation level adjustment indication corresponds with a level of ambient noise in the audio environment and changing the timbre-preserving functionality involves changing the timbre-preserving functionality based, at least in part, on the level of ambient noise. In this example, the noise compensation level adjustment indication indicates, and/or is in response to, a high level of ambient noise. It can be seen in the graph 200D that the frequency bands of FIG. 2B that were previously tuned to be dependent and timbre-preserving (the frequency bands corresponding to the line segment 205D) are allowed to be fully independent in this example. In this example, the input audio corresponds to white noise that is at a level that causes limiting in the multiband limiter.

In some instances, one or more previously-received user input level adjustment indications may have previously pushed the input level of one or more frequency bands into a limiting region of a multiband limiter configuration. According to some such examples, the resulting multiband limiter configuration may be a linear combination of 205D and 205C (such as a crossfade between the two). In some other implementations, the multiband limiter configuration responsive to the noise compensation level adjustment indication may override the timbre-preserving response to the user input level adjustment indication. Some examples are described below.

Figure 2E:
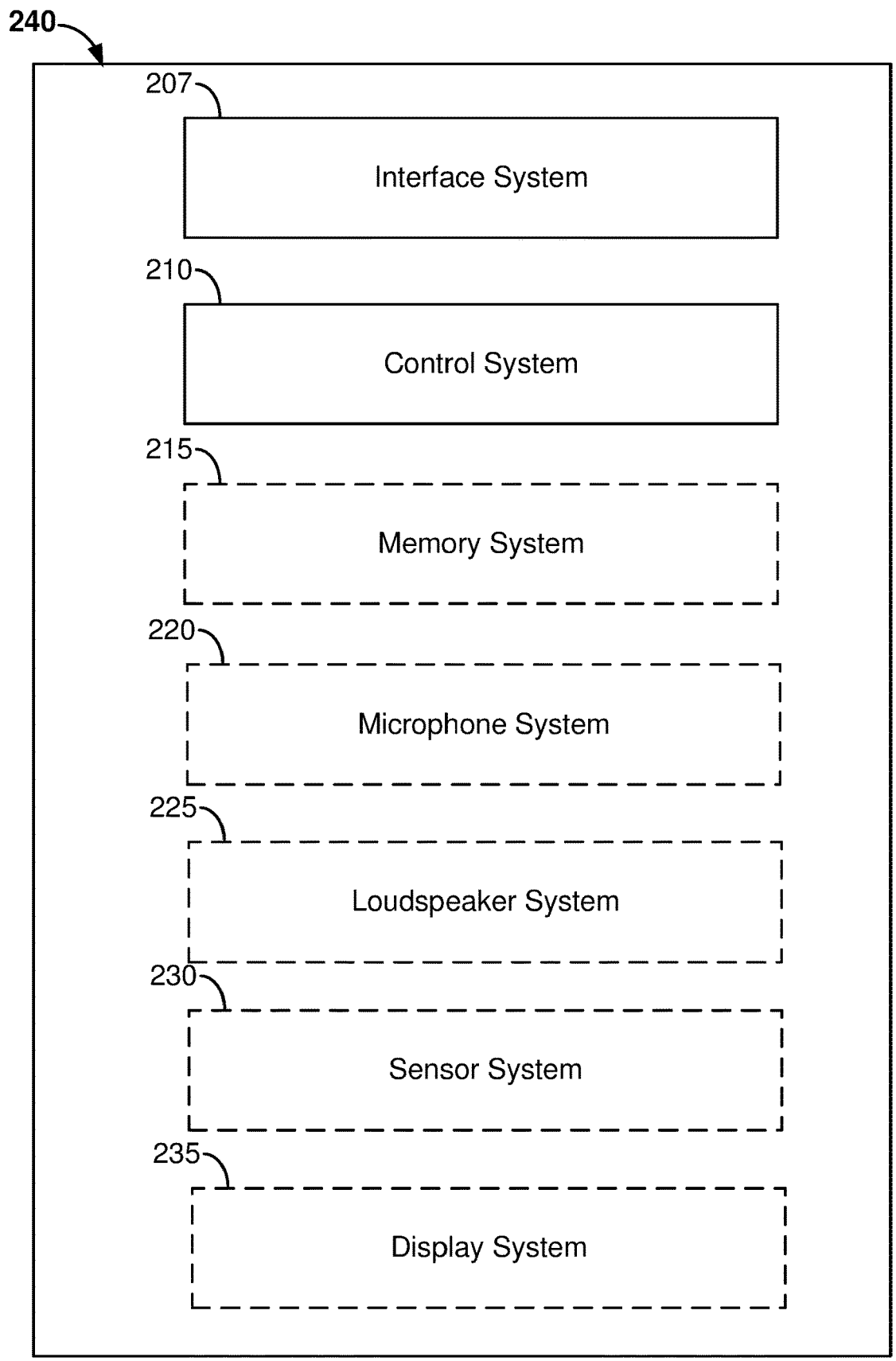
FIG. 2E is a block diagram that shows examples of components of an apparatus capable of implementing various aspects of this disclosure.

FIG. 2E is a block diagram that shows examples of components of an apparatus capable of implementing various aspects of this disclosure. As with other figures provided herein, the types and numbers of elements shown in FIG. 2E are merely provided by way of example. Other implementations may include more, fewer and/or different types and/or numbers of elements. According to some examples, the apparatus 240 may be configured for performing at least some of the methods disclosed herein. In some implementations, the apparatus 240 may be, or may include, a television, one or more components of an audio system, a mobile device (such as a cellular telephone), a laptop computer, a tablet device, a smart speaker, or another type of device. In some implementations, the apparatus 240 may be, or may include, a television control module. The television control module may or may not be integrated into a television, depending on the particular implementation. In some implementations, the television control module may be a separate device from a television and may, in some instances, either be sold separately from a television or as an add-on or optional device that may be included with a purchased television. In some implementations, the television control module may be obtainable from a content provider, such as a provider of television programs, movies, etc.

According to some alternative implementations the apparatus 240 may be, or may include, a server. In some such examples, the apparatus 240 may be, or may include, an encoder. Accordingly, in some instances the apparatus 240 may be a device that is configured for use within an audio environment, such as a home audio environment, whereas in other instances the apparatus 240 may be, or may include, a device that is configured for use in "the cloud," e.g., a server.

In this example, the apparatus 240 includes an interface system 207 and a control system 210. The interface system 207 may, in some implementations, be configured for communication with one or more other devices of an audio environment. The audio environment may, in some examples, be a home audio environment. In other examples, the audio environment may be another type of environment, such as an office environment, an automobile environment, a train environment, a street or sidewalk environment, a park environment, etc. The interface system 207 may, in some implementations, be configured for exchanging control information and associated data with audio devices of the audio environment. The control information and associated data may, in some examples, pertain to one or more software applications that the apparatus 240 is executing.

The interface system 207 may, in some implementations, be configured for receiving, or for providing, a content stream. The content stream may include audio data. The audio data may include, but may not be limited to, audio signals. In some instances, the audio data may include spatial data, such as channel data and/or spatial metadata.

The interface system 207 may include one or more network interfaces and/or one or more external device interfaces (such as one or more universal serial bus (USB) interfaces). According to some implementations, the interface system 207 may include one or more wireless interfaces. The interface system 207 may include one or more devices for implementing a user interface, such as one or more microphones, one or more speakers, a display system, a touch sensor system and/or a gesture sensor system. In some examples, the interface system 207 may include one or more interfaces between the control system 210 and a memory system, such as the optional memory system 215 shown in FIG. 2E. However, the control system 210 may include a memory system in some instances. The interface system 207 may, in some implementations, be configured for receiving input from one or more microphones in an environment.

The control system 210 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some implementations, the control system 210 may reside in more than one device. For example, in some implementations a portion of the control system 210 may reside in a device within an audio environment and another portion of the control system 210 may reside in a device that is outside of the audio environment, such as a server, a mobile device (e.g., a smartphone or a tablet computer), etc. In other examples, a portion of the control system 210 may reside in a device within one of the environments depicted herein and another portion of the control system 210 may reside in one or more other devices of the audio environment. For example, control system functionality may be distributed across multiple smart audio devices of an audio environment, or may be shared by an orchestrating device (such as what may be referred to herein as a smart home hub) and one or more other devices of the audio environment. In other examples, a portion of the control system 210 may reside in a device that is implementing a cloud-based service, such as a server, and another portion of the control system 210 may reside in another device that is implementing the cloud-based service, such as another server, a memory device, etc. The interface system 207 also may, in some examples, reside in more than one device.

In some implementations, the control system 210 may be configured for performing, at least in part, the methods disclosed herein. According to some examples, the control system 210 may be configured for implementing methods of content stream processing.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. The one or more non-transitory media may, for example, reside in the optional memory system 215 shown in FIG. 2E and/or in the control system 210. Accordingly, various innovative aspects of the subject matter described in this disclosure can be implemented in one or more non-transitory media having software stored thereon. The software may, for example, include instructions for controlling at least one device to process a content stream, to encode a content stream, to decode a content stream, etc. The software may, for example, be executable by one or more components of a control system such as the control system 210 of FIG. 2E.

In some examples, the apparatus 240 may include the optional microphone system 220 shown in FIG. 2E. The optional microphone system 220 may include one or more microphones. In some implementations, one or more of the microphones may be part of, or associated with, another device, such as a speaker of the speaker system, a smart audio device, etc. In some examples, the apparatus 240 may not include a microphone system 220. However, in some such implementations the apparatus 240 may nonetheless be configured to receive microphone data for one or more microphones in an audio environment via the interface system 210. In some such implementations, a cloud-based implementation of the apparatus 240 may be configured to receive microphone data, or a noise metric corresponding at least in part to the microphone data, from one or more microphones in an audio environment, or from one or more devices in the audio environment that include at least one microphone, via the interface system 210.

According to some implementations, the apparatus 240 may include the optional loudspeaker system 225 shown in FIG. 2E. The optional loudspeaker system 225 may include one or more loudspeakers, which also may be referred to herein as "speakers" or, more generally, as "audio reproduction transducers." In some examples (e.g., cloud-based implementations), the apparatus 240 may not include a loudspeaker system 225. However, in some such examples one or more other devices of the audio environment may implement the loudspeaker system 225.

In some implementations, the apparatus 240 may include the optional sensor system 230 shown in FIG. 2E. The optional sensor system 230 may include one or more touch sensors, gesture sensors, motion detectors, etc. According to some implementations, the optional sensor system 230 may include one or more cameras. In some implementations, the cameras may be free-standing cameras. In some examples, one or more cameras of the optional sensor system 230 may reside in a smart audio device, which may be a single purpose audio device or a virtual assistant. In some such examples, one or more cameras of the optional sensor system 230 may reside in a television, a mobile phone or a smart speaker. In some examples, the apparatus 240 may not include a sensor system 230. However, in some such implementations the apparatus 240 may nonetheless be configured to receive sensor data for one or more sensors in an audio environment via the interface system 210.

In some implementations, the apparatus 240 may include the optional display system 235 shown in FIG. 2E. The optional display system 235 may include one or more displays, such as one or more light-emitting diode (LED) displays. In some instances, the optional display system 235 may include one or more organic light-emitting diode (OLED) displays. In some examples, the optional display system 235 may include one or more displays of a television. In other examples, the optional display system 235 may include a laptop display, a mobile device display, or another type of display. In some examples wherein the apparatus 240 includes the display system 235, the sensor system 230 may include a touch sensor system and/or a gesture sensor system proximate one or more displays of the display system 235. According to some such implementations, the control system 210 may be configured for controlling the display system 235 to present one or more graphical user interfaces (GUIs).

According to some such examples the apparatus 240 may be, or may include, a smart audio device. In some such implementations the apparatus 240 may be, or may include, a wakeword detector. For example, the apparatus 240 may be, or may include, a virtual assistant.

Figure 3:
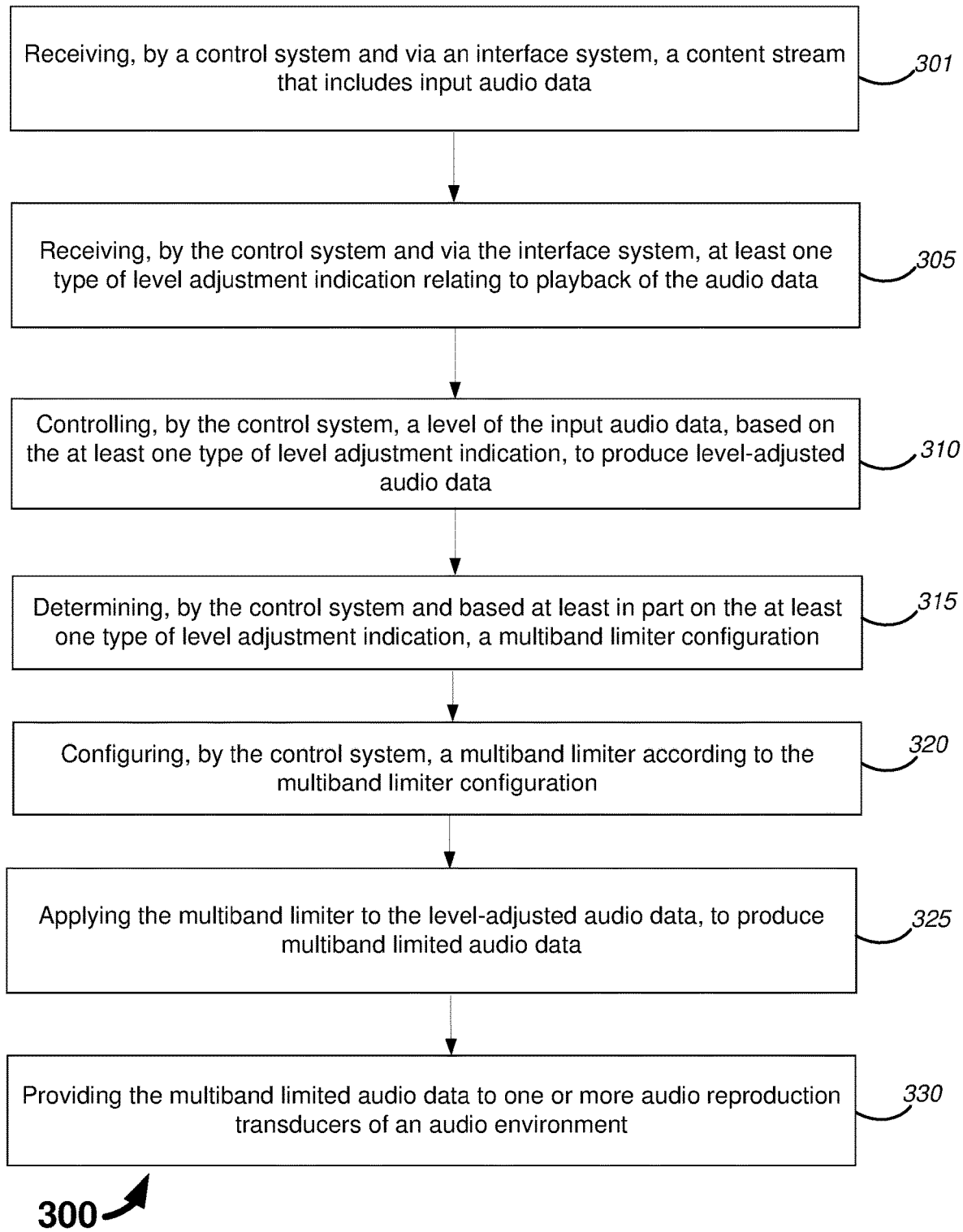
FIG. 3 is a flow diagram that outlines an example of a disclosed method.

FIG. 3 is a flow diagram that outlines an example of a disclosed method. The blocks of method 300, like other methods described herein, are not necessarily performed in the order indicated. Moreover, such methods may include more or fewer blocks than shown and/or described.

The method 300 may be performed by an apparatus or system, such as the apparatus 240 that is shown in FIG. 2E and described above. In some examples, the blocks of method 300 may be performed by one or more devices within an audio environment, e.g., an audio system controller or another component of an audio system, such as a smart speaker, a television, a television control module, a mobile device, etc. In some implementations, the audio environment may include one or more rooms of a home environment. In other examples, the audio environment may be another type of environment, such as an office environment, an automobile environment, a train environment, a street or sidewalk environment, a park environment, etc. However, in alternative implementations at least some blocks of the method 300 may be performed by a device that implements a cloud-based service, such as a server.

In this example, block 301 involves receiving, by a control system and via an interface system (e.g., by the control system 210 and via the interface system 207 of FIG. 2E), a content stream that includes input audio data. In some examples, the content stream may include video data corresponding to the audio data. In some implementations, the control system and the interface system may be the control system 210 and the interface system 207 shown in FIG. 2E and described above. In some implementations, the control system may be the control system 110 shown in FIG. 1M and described above. In some examples, block 301 may involve the level adjuster 152 of FIG. 1M receiving the input audio data 151. According to some implementations, block 301 may involve receiving an encoded content stream. In such implementations, block 301 may involve decoding the encoded content stream. The content stream may, for example, correspond to a movie, a television program, music, a music video, a podcast, etc.

In this implementation, block 305 involves receiving, by the control system and via the interface system, at least one type of level adjustment indication relating to playback of the audio data. In some instances, the at least one type of level adjustment indication may include a user input level adjustment indication received via user input, e.g., via a remote control, via a voice command, etc. According to some implementations, block 305 may involve the level adjuster 152 of FIG. 1M receiving the user input 163.

Alternatively, or additionally, the at least one type of level adjustment indication may include a noise compensation level adjustment indication received from a noise compensation module. According to some implementations, block 305 may involve the level adjuster 152 of FIG. 1M receiving the noise estimator output 160. The noise compensation level adjustment indication may, for example, be responsive to a level of ambient noise detected by the noise compensation module, or detected by one or more microphones from which the noise compensation module is configured to receive microphone signals. According to some implementations, block 305 may involve the level adjuster 152 of FIG. 1M receiving the noise estimator output 160.

In this example, block 310 involves controlling, by the control system, a level of the input audio data, based on the at least one type of level adjustment indication, to produce level-adjusted audio data. According to some implementations, in block 310 the level adjuster 152 of FIG. 1M may produce the level-adjusted audio data 153 based on the user input 163 and/or the noise estimator output 160.

According to this example, block 315 involves determining, by the control system and based at least in part on the at least one type of level adjustment indication, a multiband limiter configuration. According to some examples, the control system 110 shown in FIG. 1M may determine, based at least in part on the user input 163 and/or the noise estimator output 160, a multiband limiter configuration. In some such examples, the level adjuster 152 of FIG. 1M may determine, based at least in part on the user input 163 and/or the noise estimator output 160, a multiband limiter configuration.

According to some implementations, determining the multiband limiter configuration may involve determining a timbre-preserving configuration if the level adjustment indication (e.g., if the only level adjustment indication) is a user input level adjustment indication. The timbre-preserving configuration may, in some instances, be frequency band dependent. For example, some frequency bands may be partially or completely isolated. According to some examples, the levels of completely isolated frequency bands may be controlled independently, without reference to the levels and/or thresholds of other frequency bands.

In some examples, determining the multiband limiter configuration may involve changing a timbre-preserving functionality if at least one type of level adjustment indication is a noise compensation level adjustment indication. In some such examples, changing the timbre-preserving functionality may involve at least partially disabling the timbre-preserving functionality. In some implementations, the noise compensation level adjustment indication may correspond with a level of ambient noise in an audio environment. In some such examples, the timbre-preserving functionality may be changed based, at least in part, on the level of ambient noise.

According to some implementations, both a user input level adjustment indication and a noise compensation level adjustment indication may be received. In some such implementations, determining the multiband limiter configuration may involve determining a partially timbre-preserving configuration that is based, at least in part, on an average (e.g., a weighted average) of a multiband limiter configuration corresponding to the user input level adjustment indication and a multiband limiter configuration corresponding to the noise compensation level adjustment indication.

In this example, block 320 involves configuring, by the control system, a multiband limiter according to the multiband limiter configuration. In some such examples, the level adjuster 152 of FIG. 1M may send control signals 161 indicating a multiband limiter configuration for the multiband limiter 154 to apply. In some implementations, if the received level adjustment indication is a user input level adjustment indication, the timbre preservation settings of the multiband limiter 154 may be kept as the multiband limiter 154 was originally tuned, e.g., at a factory. Such implementations can help to ensure that the user has a pleasant experience when the user is adjusting a volume control.

According to some examples, if the received level adjustment indication is a noise compensation level adjustment indication, the timbre preservation settings of the multiband limiter 154 may be gradually turned off, e.g., in proportion to the noise compensation level adjustment indication. In some such examples, when noise is present the played-back audio content may still be intelligible over the noise with the loss of fidelity being masked by the noise source.

According to this implementation, block 325 involves applying the multiband limiter to the level-adjusted audio data, to produce multiband limited audio data. In some such examples, the multiband limiter 154 of FIG. 1M may produce the multiband limited audio data 155 in block 325. In some implementations, method 300 may involve reproducing the multiband limited audio data on one or more audio reproduction transducers of the audio environment, to provide reproduced audio data. For example, method 300 may involve reproducing the multiband limited audio data 155 via the loudspeaker 156 of FIG. 1M.

Figure 4A:
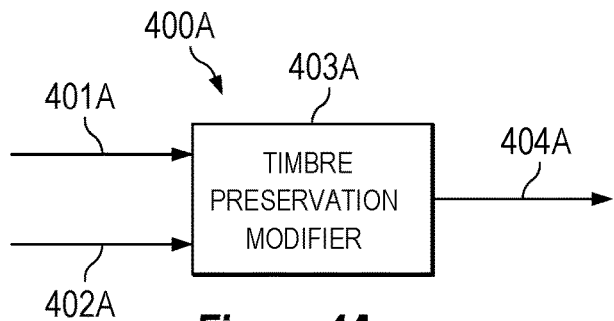
FIGS. 4A and 4B show examples of timbre preservation modifier modules.
Figure 4B:
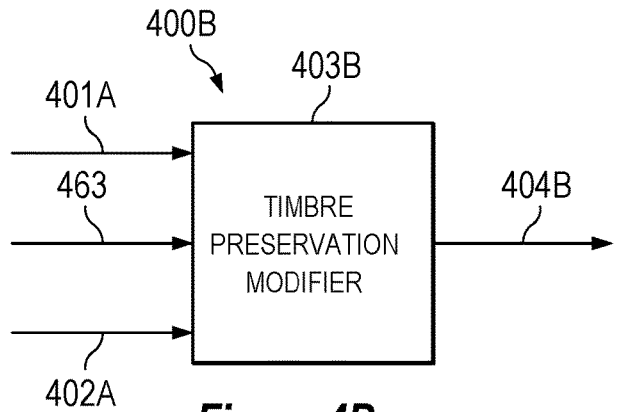

FIGS. 4A and 4B show examples of timbre preservation modifier modules. The timbre preservation modifier modules may, for example, be implemented via the control system 110 of FIG. 1M or the control system 210 of FIG. 2E. In some examples, the timbre preservation modifier modules 403A and 403B may be implemented via the level adjuster 152 of FIG. 1M. In some alternative implementations, the timbre preservation modifier modules 403A and 403B may be implemented via the multiband limiter 154 of FIG. 1M or via another element of the control system 110 that is not illustrated in FIG. 1M.

In the example shown in FIG. 4A, the timbre preservation modifier module 403A is configured to control the amount of timbre preservation that is used at any point in time. In this example, the timbre preservation modifier module 403A is configured to control the amount of timbre preservation based, at least in part, on a noise estimate 402A. In this example, element 401A represents an original timbre preservation setting of a multiband limiter. For example, the element 401A may represent a timbre preservation setting indicated by the element 212 in the examples shown in FIGS. 2A and 2B, e.g., the numerical value in the window portion 212b of FIG. 2B.

The noise estimate 402A is an example of what may be referred to herein as a noise compensation level adjustment indication. In some examples, the noise estimate 402A may be an average, a median or a maximum noise level over the range of audible frequencies, or over a subset of the audible frequency bands. In some examples, the noise estimate 402A may be a spectral noise estimate of the ambient noise that is determined by the noise estimator 159 provided to the level adjuster 152. In some instances, the level adjuster 152 (or another component of the control system) may be configured to determine the noise estimate 402A based on the noise estimator output 160.

According to this example, when the noise estimate 402A indicates that the noise level is high, the timbre preservation modifier module 403A is configured to control the amount of timbre preservation in the modified timbre preservation amount 404A to be low. Conversely, when the noise estimate 402A indicates that the noise level is low, the timbre preservation modifier module 403A is configured to control the amount of timbre preservation in the modified timbre preservation amount 404A to be high (or unmodified).

In the example shown in FIG. 4B, the timbre preservation modifier module 403B is configured to control the amount of timbre preservation based, at least in part, on the noise estimate 402A and a user volume setting 463. The user volume setting 463 is an example of what is referred to herein as a user input level adjustment indication.

According to this example, the timbre preservation modifier module 403B is configured to determine the modified timbre preservation amount 404B according to the following expression:

$$\text{Timbre Preservation Amount} = A^* \text{gain}_{user} + B^* \text{gain}_{noisecomp} \quad \text{(Equation 4)}$$

In Equation 4, A represents an original timbre preservation amount, which corresponds with the element 401A in this example. For example, A may represent a timbre preservation setting indicated by the element 212 in the examples shown in FIGS. 2A and 2B, e.g., the numerical value in the window portion 212b of FIG. 2B. Here, $\text{gain}_{user}$ represents the gain applied by a user, which is the user volume setting 463 in the example shown in FIG. 4B. In Equation 4, $\text{gain}_{noisecomp}$ represents a noise compensation level adjustment indication, which is the noise estimate 402A in the example shown in FIG. 4B. In the case of a broadband noise compensation system, $\text{gain}_{noisecomp}$ may be a broadband gain. Alternatively, $\text{gain}_{noisecomp}$ may be an weighted average gain that is applied by a multiband noise compensation system. In Equation 4, B represents a timbre preservation value. The timbre preservation value B may, for example, indicate the minimum amount of timbre preservation that is allowed. The timbre preservation value B may indicate, e.g., how much timbre preservation the system would have when the volume has been mainly adjusted by the noise compensator. The timbre preservation value B may, for example, be set by a manufacturer during a device tuning operation.

According to some implementations, the "gain" terms of Equation 4 are not intended to represent unmodified gains, but rather are intended to represent a proportion of the gain that is applied by the control system. For example, if 75% of the gain that was applied by the control system were based on the user volume setting 463, the $\text{gain}_{user}$ would be 0.75.

Accordingly, 25% of the gain would be based on the noise estimate 402A, so the $\text{gain}_{noisecomp}$ would be 0.25.

According to this example, if the noise estimate 402A is low, the timbre preservation amount will be close to the original tuning timbre preservation value (represented by the A gain term). In this example, if the user volume setting 463 is high and the noise estimate 402A is also high then the timbre will be partially preserved, in proportion to the relative values of the user volume setting 463 and the noise estimate 402A. According to this example, if the noise estimate 402A is high and the user volume setting 463 is low then the B gain term of Equation 4 will dominate and the timbre will not be preserved.

Figure 4C:
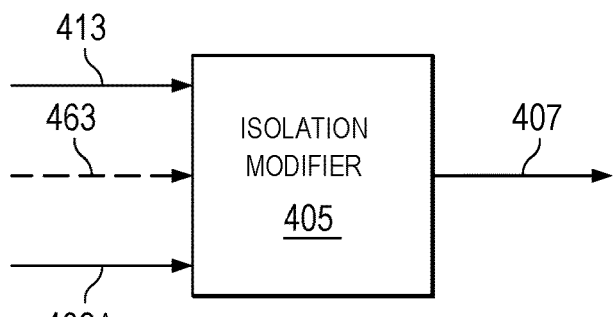
FIG. 4C shows an example of a frequency band isolation modifier.

FIG. 4C shows an example of a frequency band isolation modifier. The frequency band isolation modifier 405 may, for example, be implemented via the control system 210 of FIG. 2E. In some implementations, the frequency band isolation modifier 405 may be implemented via the control system 110 of FIG. 1M, e.g., by the level adjuster 152 and/or the multiband limiter 154. In some implementations, the frequency band isolation modifier 405 may be implemented as an alternative to implementations that include the timbre preservation modifier module 403A or the timbre preservation modifier module 403B. However, some implementations may include the frequency band isolation modifier 405 with the timbre preservation modifier module 403A or the timbre preservation modifier module 403B, e.g., to allow frequency band isolation modification of bass bands, such as the 4 bass bands of FIG. 2B that are shown to be completely isolated.

In this example, the frequency band isolation modifier 405 is shown receiving isolation settings 413 for each of a plurality of frequency bands. The plurality of frequency bands may, in some instances, include all frequency bands. In other examples, plurality of frequency bands may include frequency bands for which timbre preservation would otherwise be applied, e.g., the non-isolated frequency bands of FIG. 2B.

According to this example, the frequency band isolation modifier 405 is also shown receiving an optional user volume setting 463 and a noise estimate 402A. In some examples, the noise estimate 402A may be for a particular frequency band. In alternative examples, the noise estimate 402A may be for a subset of frequency bands, e.g., a subset of frequency bands that may potentially have their isolation value modified by the frequency band isolation modifier 405. In some examples, the noise estimate 402A may be for all frequency bands.

In this example, the frequency band isolation modifier 405 is configured to determine whether to modify a frequency band's isolation value and, if so, to produce a modified frequency band isolation value 407 for that frequency band. The frequency band isolation value modification may be a binary modification or a non-binary modification, depending on the particular implementation. In the case of a binary modification, in some examples the frequency band isolation value may be converted from non-isolated to isolated if the ambient noise level is high. In some such examples, if the ambient noise level is low or the frequency band was already isolated, then there may be no change to the frequency band isolation value. In some examples, the ambient noise level may be based upon the full frequency spectrum. In other examples, the ambient noise level may be specific to the band frequency for which the isolation is being potentially modified.

In some alternative implementations, instead of being entirely isolated or entirely not isolated, a frequency band may be partially isolated (e.g., 25% isolated, 50% isolated, 75% isolated, etc.). In some such examples, the degree to which a frequency band is isolated may correspond to a level of ambient noise in the audio environment. The degree to which a frequency band is isolated may, for example, correspond to a weighting value that is used to weight selected frequency bands less heavily than non-isolated frequency bands in a timbre preservation method.

In some such examples, the degree to which a frequency band's contribution to a timbre preservation algorithm is weighted may, for example, correspond to (1−I), where I represents the degree to which a frequency band is isolated. In one such example, if a frequency band is 75% isolated, I would equal 0.75 and the degree to which the frequency band's contribution to a timbre preservation algorithm is weighted would be 0.25. In another such example, if a frequency band is 100% isolated, I would equal 1.0 and the degree to which the frequency band's contribution to a timbre preservation algorithm is weighted would be 0.0: in other words, the threshold corresponding to the frequency band would not be used in the timbre preservation calculation.

Returning to FIG. 3, in some examples the method 300 may involve a control system causing a noise compensation module operation change, e.g., responsive to predetermined inputs, metrics and/or circumstances. For example, as described above with reference to FIG. 1M, in some implementations the level adjuster 152 may be configured to send control signals 164 to the noise estimator 159. In some implementations, the multiband limiter 154 may be configured to send control signals 167 to the noise estimator 159. In some examples, the control signals 164 and/or the control signals 167 may cause a noise compensation module operation change (e.g., a change in the functionality of the noise estimator 159). The noise compensation module may be a subsystem or module of the control system, e.g., as shown in FIG. 1M.

Some such examples may involve causing a noise compensation module operation change when the multiband limited audio data (e.g., the multiband limited audio data 155 that is output by the multiband limiter 154) causes one or more audio reproduction transducers of the audio environment (e.g., the loudspeaker 156) to operate outside a linear range. In some such instances, the control system may cause the one or more audio reproduction transducers of the audio environment to operate outside the linear range based, at least in part, on a noise compensation level adjustment indication and/or an ambient noise estimate. For example, the multiband limited audio data that causes one or more audio reproduction transducers of the audio environment to operate outside a linear range may be based on a noise compensation level adjustment that corresponds to a high level of ambient noise in the audio environment.

According to some examples, the noise compensation module operation change may involve changing an echo canceller functionality of the noise compensation module. For example, the noise compensation module operation change may involve causing the noise compensation module to use only "quiet" playback intervals as input to a noise estimator of the noise compensation module. The "quiet" playback intervals may be instances of audio signals at or below a threshold level (e.g., a predetermined threshold level) in at least one of a frequency band or a time interval. In some implementations, "quiet" playback intervals may be instances during which audio reproduction transducers of the audio environment are acting within their linear ranges.

As noted elsewhere herein, in some implementations a level adjuster module of the control system (e.g., the level adjuster 152 of FIG. 1M) may be configured for controlling the level of input audio data to produce level-adjusted audio data (e.g., the level-adjusted audio data 153). In some such implementations, method 300 also may involve providing multiband limiter feedback from the multiband limiter to the level adjuster module, e.g., via the control signals 162 that are illustrated in FIG. 1M. According to some such examples, the multiband limiter feedback may indicate an amount of limiting that the multiband limiter is applying to each of a plurality of frequency bands of the level-adjusted audio data.

In some such implementations, method 300 also may involve controlling, by the level adjuster module, a level of one or more frequency bands of the plurality of frequency bands based, at least in part, on the multiband limiter feedback. In some such examples, method 300 may involve reducing the level of one or more frequency bands of the plurality of frequency bands based, at least in part, on multiband limiter feedback indicating that the levels of one or more frequency bands, or other frequency bands, are being limited. In some examples, a level adjuster may be configured for modifying level-adjusted audio data according to compression feedback signals from a multiband limiter as described above with reference to FIG. 1N.

Figure 5:
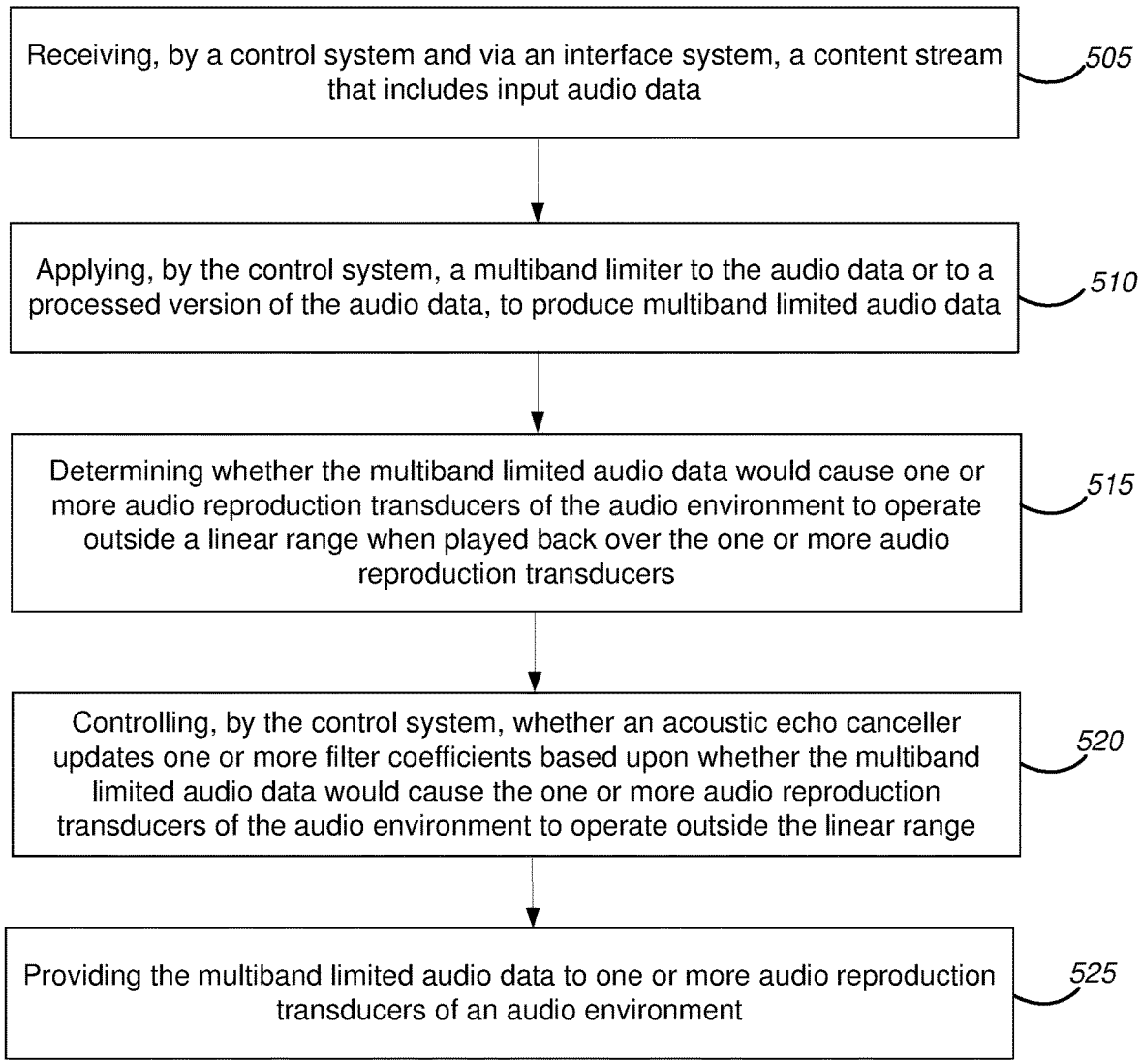
FIG. 5 is a flow diagram that outlines an example of another disclosed method.

FIG. 5 is a flow diagram that outlines an example of another disclosed method. The blocks of method 500, like other methods described herein, are not necessarily performed in the order indicated. Moreover, such methods may include more or fewer blocks than shown and/or described.

The method 500 may be performed by an apparatus or system, such as the apparatus 240 that is shown in FIG. 2E and described above. In some examples, the blocks of method 500 may be performed by one or more devices within an audio environment, e.g., an audio system controller or another component of an audio system, such as a smart speaker, a television, a television control module, a smart speaker, a mobile device, etc. In some implementations, the audio environment may include one or more rooms of a home environment. In other examples, the audio environment may be another type of environment, such as an office environment, an automobile environment, a train environment, a street or sidewalk environment, a park environment, etc. However, in alternative implementations at least some blocks of the method 500 may be performed by a device that implements a cloud-based service, such as a server.

In this example, block 505 involves receiving, by a control system and via an interface system (e.g., by the control system 210 and via the interface system 207 of FIG. 2E), a content stream that includes input audio data. In some examples, the content stream may include video data corresponding to the audio data. In some implementations, the control system and the interface system may be the control system 210 and the interface system 207 shown in FIG. 2E and described above. In some implementations, the control system and the interface system may be the control system 110 shown in FIG. 1M and described above. In some examples, block 505 may involve the level adjuster 152 of FIG. 1M receiving the input audio data 151. According to some implementations, block 505 may involve receiving an encoded content stream. In such implementations, block 505 may involve decoding the encoded content stream. The content stream may, for example, correspond to a movie, a television program, music, a music video, a podcast, etc.

According to this example, block 510 involves applying, by the control system, a multiband limiter to the audio data or to a processed version of the audio data, to produce multiband limited audio data. In some such examples, the multiband limiter 154 of FIG. 1M may produce the multiband limited audio data 155 in block 510.

In this example, block 515 involves determining whether the multiband limited audio data would cause one or more audio reproduction transducers of an audio environment to operate outside a linear range when played back over the one or more audio reproduction transducers. In some such examples, the control system may cause the one or more audio reproduction transducers of the audio environment to operate outside the linear range based, at least in part, on at least one of a noise compensation level adjustment indication or a noise estimate. For example, multiband limited audio data that causes one or more audio reproduction transducers of the audio environment to operate outside a linear range may be based on a noise compensation level adjustment that corresponds to a high level of ambient noise in the audio environment.

In some implementations, block 515 may involve referencing a data structure that indicates maximum levels for operation within a linear range for each of a plurality of frequency bands. In some such examples, these maximum linear range levels may correspond to the dots 201 of FIGS. 2A and 2B. For example, a control system may retrieve the maximum linear range levels from a memory. In some examples, block 515 may involve referencing a data structure that indicates maximum levels for operation within a non-linear range for each of the plurality of frequency bands. In some such examples, these maximum non-linear range levels may correspond to the dots 218 of FIGS. 2A and 2B.

According to this example, block 520 involves controlling, by the control system, whether an acoustic echo canceller updates one or more filter coefficients based upon whether the multiband limited audio data would cause the one or more audio reproduction transducers of the audio environment to operate outside the linear range. According to some such examples, controlling whether the acoustic echo canceller updates the one or more filter coefficients may involve controlling the acoustic echo canceller to not update the one or more filter coefficients if the multiband limited audio data would cause the one or more audio reproduction transducers of the audio environment to operate outside the linear range. In some examples, block 520 may involve controlling, by the control system, whether a noise estimator updates noise estimates based upon whether the multiband limited audio data would cause the one or more audio reproduction transducers of the audio environment to operate outside the linear range. According to some such examples, the noise estimator may not be configured to implement an acoustic echo canceller.

For example, the acoustic echo canceller may normally operate by updating (e.g., periodically updating) coefficients of adaptive filters for each of a plurality of frequency bands. The acoustic echo canceller may, in some instances, be implemented by the noise estimator 159 of FIG. 1M. In some such implementations, the control signals 164 (or the control signals 167) may control the acoustic echo canceller of the noise estimator 159 to not update the filter coefficients if the multiband limited audio data 155 would cause the loudspeaker 156 (or one or more other audio reproduction transducers of the audio environment) to operate outside a linear range. According to some implementations, the noise compensation system 150 may include one or more devices that are configured as a wakeword detector. In some such implementations, an echo-cancelled version of the microphone signals 158 may be provided to the wakeword detector. The acoustic echo canceller may, in some instances, be implemented by a device that is configured as a wakeword detector. Not updating the filter coefficients if the multiband limited audio data 155 would cause one or more other audio reproduction transducers of the audio environment to operate outside a linear range may improve the performance of the wakeword detector, at least in part because the echo-cancelled version of the microphone signals 158 that are provided to the wakeword detector may more accurately correspond with voice commands provided to the wakeword detector. Here, block 525 involves providing the multiband limited audio data to the one or more audio reproduction transducers of the audio environment.

In some examples, the method 500 (e.g., block 510) may involve applying the multiband limiter to level-adjusted audio data, e.g., as described above with reference to FIG. 3. In such examples, the level-adjusted audio data is an example of the "processed version of the audio data" that is referenced in block 510. Such examples may involve controlling, by the control system, a level of the input audio data, based on at least one type of level adjustment indication, to produce level-adjusted audio data. Some such examples may involve receiving, by the control system, at least one type of level adjustment indication relating to playback of the audio data, determining, by the control system and based at least in part on the at least one type of level adjustment indication, a multiband limiter configuration and configuring, by the control system, the multiband limiter according to the multiband limiter configuration. In some examples, the at least one type of level adjustment indication may include at least one of a user input level adjustment indication received via user input or a noise compensation level adjustment indication received from a noise compensation module that includes the acoustic echo canceller.

According to some implementations, determining the multiband limiter configuration may involve determining a timbre-preserving configuration if the level adjustment indication (e.g., if the only level adjustment indication) is a user input level adjustment indication. The timbre-preserving configuration may, in some instances, be frequency band dependent. For example, some frequency bands may be partially or completely isolated. The levels of completely isolated frequency bands may be controlled independently, without reference to the levels and/or thresholds of other frequency bands.

In some examples, determining the multiband limiter configuration may involve changing a timbre-preserving functionality if receiving at least one type of level adjustment indication is a noise compensation level adjustment indication. In some such examples, changing the timbre-preserving functionality may involve at least partially disabling the timbre-preserving functionality. In some implementations, the noise compensation level adjustment indication may correspond with a level of ambient noise in an audio environment. In some such examples, the timbre-preserving functionality may be changed based, at least in part, on the level of ambient noise.

According to some implementations, both a user input level adjustment indication and a noise compensation level adjustment indication may be received. In some such implementations, determining the multiband limiter configuration may involve determining a timbre-preserving configuration that is based, at least in part, on an average (e.g., a weighted average) of a multiband limiter configuration corresponding to the user input level adjustment indication and a multiband limiter configuration corresponding to the noise compensation level adjustment indication.

In some examples, method 500 may involve reproducing the multiband limited audio data on the one or more audio reproduction transducers of the audio environment to provide reproduced audio data.

According to some examples, the noise compensation module operation change may involve changing an alternative, or an additional, echo canceller functionality of the noise compensation module. For example, the noise compensation module operation change may involve causing the noise compensation module to use only "quiet" playback intervals as input to a noise estimator of the noise compensation module. The "quiet" playback intervals may be instances of audio signals at or below a threshold level (e.g., a predetermined threshold level) in at least one of a frequency band or a time interval.

In some such implementations, method 500 also may involve providing multiband limiter feedback from the multiband limiter to the level adjuster module, e.g., via the control signals 162 that are illustrated in FIG. 1M. According to some such examples, the multiband limiter feedback may indicate an amount of limiting that the multiband limiter is applying to each of a plurality of frequency bands of the level-adjusted audio data.

In some such implementations, method 500 also may involve controlling, by the level adjuster module, a level of one or more frequency bands of the plurality of frequency bands based, at least in part, on the multiband limiter feedback. In some such examples, method 500 may involve reducing the level of one or more frequency bands of the plurality of frequency bands based, at least in part, on multiband limiter feedback indicating that the levels of one or more frequency bands, or other frequency bands, are being limited.

Figure 6A:
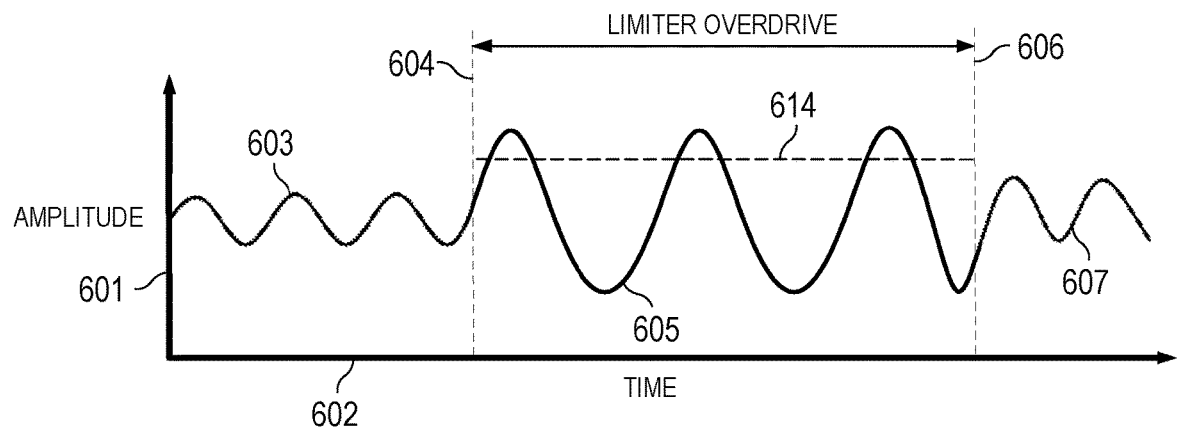
FIG. 6A is a graph that shows an example of a time interval during which a loudspeaker being overdriven.
Figure 6B:
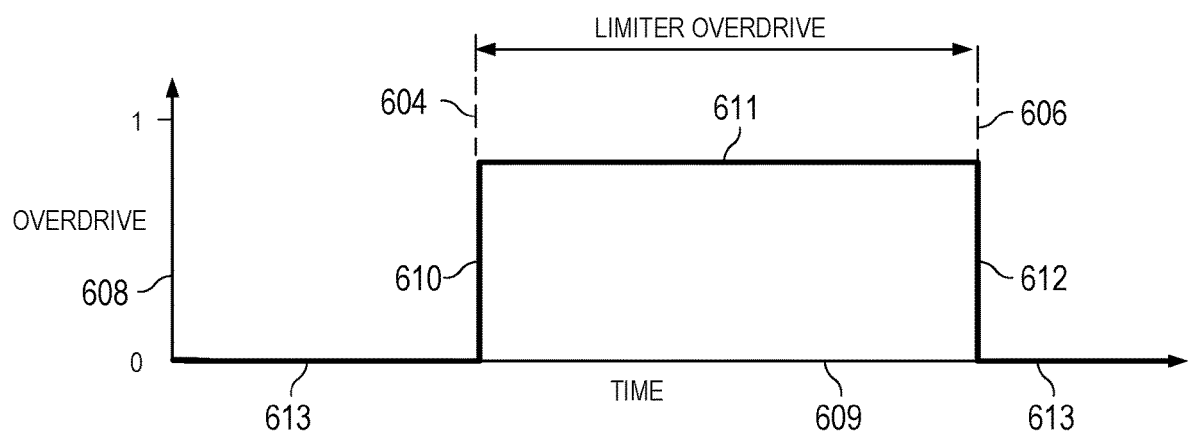
FIG. 6B shows an example of signals that may be sent to an echo canceller corresponding to the graph of FIG. 6A.

FIG. 6A is a graph that shows an example of a time interval during which a loudspeaker being overdriven. The elements of FIG. 6A are as follows:

601: The amplitude axis of the echo reference, which also may be referred to herein as a "speaker reference" or a "loudspeaker reference" for the echo canceller. One example of an echo reference is the multiband limited audio data 155 of FIG. 1M;

602: The time axis of the echo reference. The time axis 602 has the same scale as the graph of FIG. 6B;

603: A portion of the content (audio data) being played through an audio system of an audio environment. In this example the audio data is represented as a sinusoid and the loudspeaker is not being overdriven. Therefore the acoustic echo canceller is updating its filter coefficients during the corresponding time interval;

604: The start of a time interval during which the loudspeaker is being overdriven;

605: A larger amplitude sine wave representing audio data that the multiband limiter would limit if the control system were not allowing overdriving of the loudspeaker;

606: The end of the time interval during which the speaker is being overdriven;

607: A smaller amplitude sine wave representing audio data during a time interval in which the loudspeaker is once again operating within its linear range;

614: Indicates the limit at which the speaker-to-microphone path is no longer linear for this particular frequency range. When the threshold 614 of FIG. 6A is being exceeded, the audio path 165 (see FIG. 1M) from the loudspeaker 156 to the microphone 157 may include at least some sounds corresponding to non-linear distortion of the loudspeaker 156. In some examples, the threshold 614 may correspond to a single threshold for a particular frequency band (for example, the threshold 201 of FIG. 2A). Beyond this threshold 614 the echo canceller would have trouble modelling the system because at least a portion of the reproduced sound that the echo canceller would be modelling includes non-linear distortion. However, due to the fact that in many instances the corresponding overdrive setting of FIG. 6B is for a short period of time it may be acceptable for the echo canceller to not update the model during that time, because the most recently calculated coefficients prior to the overdrive time interval will be more accurate. Similarly, because the ambient noise included in microphone signals provided to a noise estimator will include non-linear distortion during the overdrive time interval, in some implementations a control system will cause the noise estimator not to provide updated noise estimates during the overdrive time interval.

FIG. 6B shows an example of signals that may be sent to an echo canceller corresponding to the graph of FIG. 6A. In this example, the signals of FIG. 6B indicate when the control system is implementing an "overdrive" mode during which a control system (e.g., the level adjuster 152 of FIG. 1M) may configure the multiband limiter to allow some distortion (e.g., in order to increase the playback volume in the presence of ambient noise), causing one or more audio reproduction transducers of the audio environment to operate outside a linear range. The "overdrive" mode may vary according to the particular implementation. For example, the amount of overdrive that is allowed during an "overdrive" mode may be frequency dependent and may, in some examples, be set during a tuning process (e.g., a factory tuning process). In some instances, the amount of overdrive that is allowed at the lower frequencies may be more than the amount of overdrive that is allowed at higher frequencies, because humans are less sensitive to distortion at lower frequencies than at higher frequencies that are within the frequency range audible to humans. According to this example, the signals of FIG. 6B indicate whether or not the acoustic echo canceller should update its filter coefficients.

The signals of FIG. 6B may, for example, be sent to an echo canceller implemented by the noise estimator 159 of FIG. 1M. The signals of FIG. 6B may, for example, be examples of the signals 167 sent to the noise estimator 159 by the multiband limiter 154. In alternative examples, the signals of FIG. 6B may be sent to an echo canceller by a broadband limiter or by the level adjuster 152 of FIG. 1M.

In this example, the elements of FIG. 6B are as follows:

608: The overdrive signal axis. In this example, the overdrive signal is 1 when the loudspeaker is being overdriven and 0 for when the loudspeaker is not being overdriven;

609: The time axis;

610: The crossover time at which the loudspeaker changes from being driven linearly to being overdriven;

611: A time interval during which the loudspeaker is being overdriven, as indicated by a 1 overdrive signal value;

612: The crossover time at which the loudspeaker changes from being overdriven to operating linearly;

613: The time intervals during which the loudspeaker is being operating linearly, as indicated by a 0 overdrive signal value.

Accordingly, in this example the signals provided to the echo canceller include an echo reference and an overdrive signal value indicating whether the speaker is operating outside its linear region. When the overdrive signal value is high (e.g., 1), in some examples the noise estimate of the noise estimator will not update to ensure that the noise estimate remains accurate. According to some implementations, when the overdrive signal value is high a noise estimator may be caused to cease or pause providing noise estimates, or to provide the same non-updated noise estimate. In some implementations, the overdrive signal value only consists of a single bit for the whole spectrum and operates in the time domain. Such implementations have the advantage of not requiring a non-linear model of the speaker. In some implementations the overdrive signal may be implemented by embedding the extra bit as part of the audio stream itself (e.g. as the least significant bit).

In some alternative implementations, the overdrive signal may be provided on a per-band basis. In some such implementations, the distortion products are assumed to be harmonic distortion or intermodulation distortion (e.g., harmonic distortion being predicted using a harmonic series of the original content and intermodulation using a Volterra series) and therefore the frequency bands in which the distortion products appear should be predictable. According to some such examples, if the frequencies of the distortion products are known, the echo canceller would not update those frequencies when the loudspeaker is known to be overdriven in the frequency band that would generate those frequencies. In some examples, if the frequencies of the distortion products are known, a noise estimator will not provide updated noise estimates for those frequencies when the loudspeaker is known to be overdriven in the frequency band that would generate those frequencies.

Figure 7:
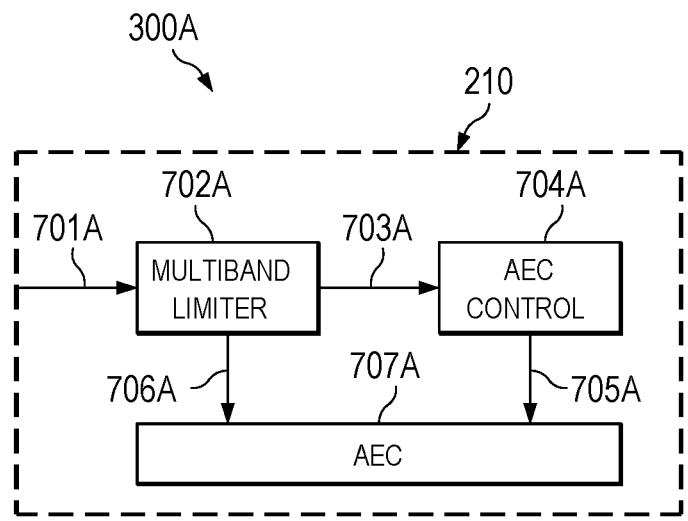
FIG. 7 shows an example of a system that is configured to control an automatic echo canceller (AEC) based at least in part on the amount of "overdrive" that is occurring in the system.

FIG. 7 shows an example of a system that is configured to control an acoustic echo canceller (AEC) based at least in part on the amount of "overdrive" that is occurring in the system. In some related implementations, a system like that shown in FIG. 7 may control a noise estimator in addition to, or instead of, an AEC. In some examples, the blocks of FIG. 7 are implemented by an instance of the control system 210 of FIG. 2E or an instance of the control system 110 of FIG. 1M. According to this implementation, the elements of FIG. 7 are as follows:

701A: The input signal to the multiband limiter;
702A: The multiband limiter, which in this example has a tuning including a threshold for each of a plurality of frequency bands above which a loudspeaker will be operating outside its linear region. In this example, the multiband limiter 702A also implements the ability to overdrive past/override these thresholds in order to provide extra volume (e.g., during periods of high ambient noise levels) at the cost of increased loudspeaker distortion;
703A: The amount of overdrive that is occurring in the system. In some examples, element 703A may correspond to the overdrive signal that is described above with reference to FIGS. 6A and 6B;
704A: An AEC controller. In this example, the AEC controller 704A is configured to indicate, based upon the amount of distortion that will be produced by one or more loudspeakers, whether the AEC 707A should update its coefficients;
705A: A signal indicating whether the AEC 707A should update its coefficients;
706A: The echo reference (or speaker feed). One example is the multiband limited audio data 155 of FIG. 1M;
707A: The AEC. In this example, the AEC 707A is a linear echo canceller that can optionally update its coefficients based upon the signals 705A.

Figure 8:
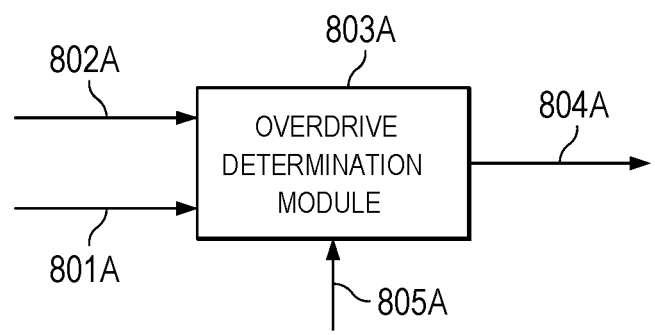
FIG. 8 shows an example of a system that is configured to determine an amount of overdrive.

FIG. 8 shows an example of a system that is configured to determine an amount of overdrive. According to this implementation, the elements of FIG. 8 are as follows:

801A: The input signal into the multiband limiter. In some examples, the input signal 801A may correspond with the level-adjusted audio data 153 of FIG. 1M;
802A: A loudspeaker model, which may include limiter thresholds for each of a plurality of frequency bands, based on capabilities of one or more loudspeakers of an audio environment. In some implementations, the loudspeaker model 802A may correspond to the least capable loudspeaker of the audio environment. The loudspeaker model 802A may, in some instances, be a more complicated model such as a harmonic distortion model or an intermodulation distortion model;
803A: The overdrive determination module. In some examples, the overdrive determination module 803A may be implemented by an instance of the control system 210 of FIG. 2E or an instance of the control system 110 of FIG. 1M. In some examples, the overdrive determination module 803A may be implemented by a multiband limiter. In some examples, the overdrive determination module 803A is configured to determine an amount of overdrive that the system will allow to be provided in speaker feed signals for one or more loudspeakers of an audio environment. In some examples, the overdrive determination module 803A may be configured to decide the amount of overdrive according to the noise estimate: if the noise estimate is high, in some such examples the system is allowed to overdrive under the assumption that any distortion caused by overdriving will be masked. In some examples, the overdrive determination module 803A may be configured to incorporate more complicated models such as a harmonic distortion model to predict the amount of distortion that the speaker will generate.
804A: The overdrive setting to use in the multiband limiter;
805A: An indication of the ambient noise.

Figure 9:
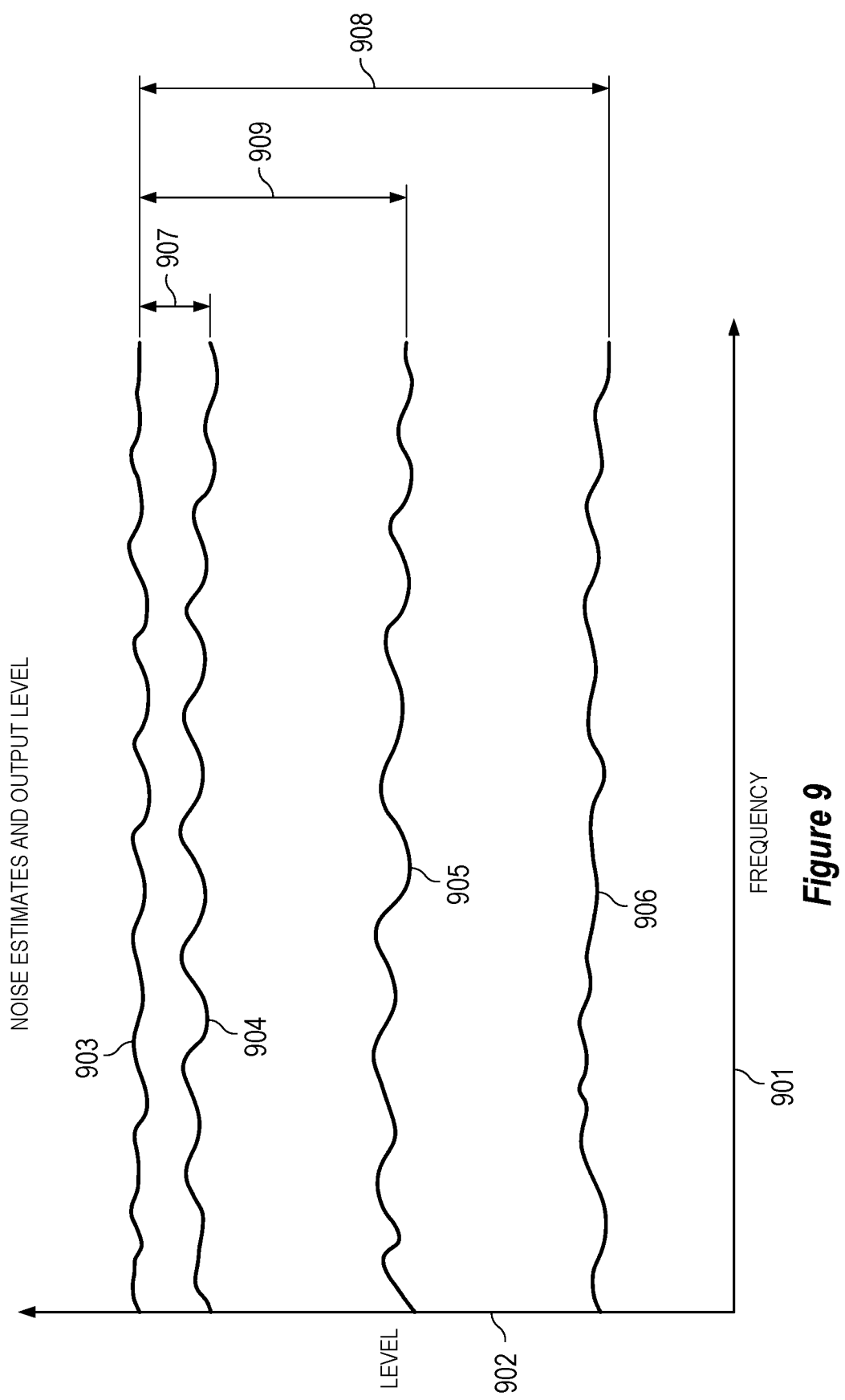
FIG. 9 is a graph of noise estimates and output level according to one example.
Figure 10:
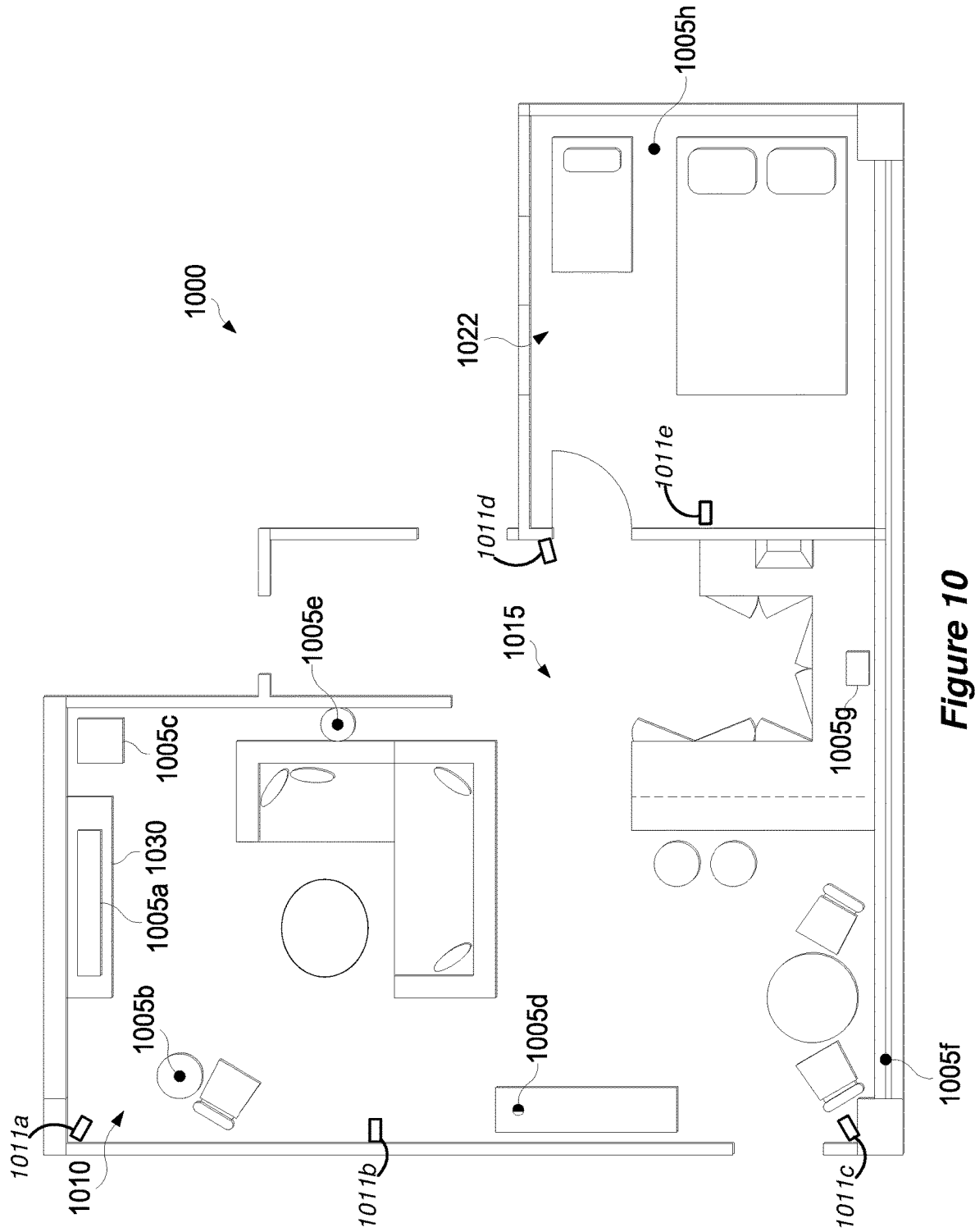

FIG. 9 is a graph of noise estimates and output level according to one example. In this example, limiting and the amount of timbre preservation or overdrive are determined based on the background noise level. According to this example, if the background noise level is low, the timbre preservation of the system is kept at a maximum. In this example, if the background noise level is high, the timbre preservation is turned off in order to maximize the volume of the system. In some implementations, the amount of overdrive may be determined based on whether the background noise level is high.

According to this example, the elements of FIG. 9 are as follows:

901: The frequency axis in Hertz;
902: The acoustic level of the systems, in dB sound pressure level (SPL);
903: The output level of the audio reproduction transducer(s) playing the audio;
904: An example of a high SPL background noise estimate. Due to the high SPL background noise estimate, in some implementations the control system may determine, or estimate, that a relatively large amount of acoustic masking of the audio may be possible;
905: An example of a medium SPL background noise estimate. Due to the medium SPL background noise estimate, in some implementations the control system may determine, or estimate, that some acoustic masking of the audio may be possible;

906: An example of a low SPL background noise estimate. Due to the low SPL background noise estimate, in some implementations the control system may determine, or estimate, that little to no acoustic masking of the audio is possible;

907: The difference between the high SPL background level and the acoustic level of the reproduced audio of the system. In this example, the control system would be operating the multiband limiter with timbre preservation turned down in the majority of the bands. According to some examples, the amount of overdrive may be increased to ensure the difference between the level of the noise and the audio signal is kept at or above a threshold (e.g., that the difference 907 is at least 2 dB, 3 dB, 4 dB, 5 dB, etc.). In some such implementations, the noise estimator/AEC would be informed as described above with reference to FIG. 7. In some such implementations, the control system may permit the audio reproduction transducer(s) to be overdriven because the control system has determined, or estimated, that a relatively large amount of acoustic masking of the audio may be possible and therefore that the introduced distortion would probably be inaudible.

908: The difference between the low SPL background level and the acoustic level of the played-back audio of the system. In some such examples, the control system would be operating the multiband limiter with timbre preservation at its maximum level, or at least at a higher level than during an instance of high background noise. According to some examples, a "maximum" level of timbre preservation may correspond with a baseline timbre preservation setting (e.g., a factory setting) for low-noise or noise-free conditions. In some implementations, the control system would not cause the audio reproduction transducer(s) to be overdriven, because the control system has determined, or estimated, that that little or no acoustic masking of the audio would occur and therefore that the introduced distortion is likely to be audible.

909: The difference between the medium SPL background level and the acoustic level of the played-back audio of the system. In some implementations the amount of timbre preservation would be in between the amount that is described above with reference to elements 908 and 907. In some such examples, overdriving the system would not be necessary or desirable because the control system has determined, or estimated, that only a moderate amount of acoustic masking of the audio would occur and therefore that the introduced distortion may be audible.

Figure 10:
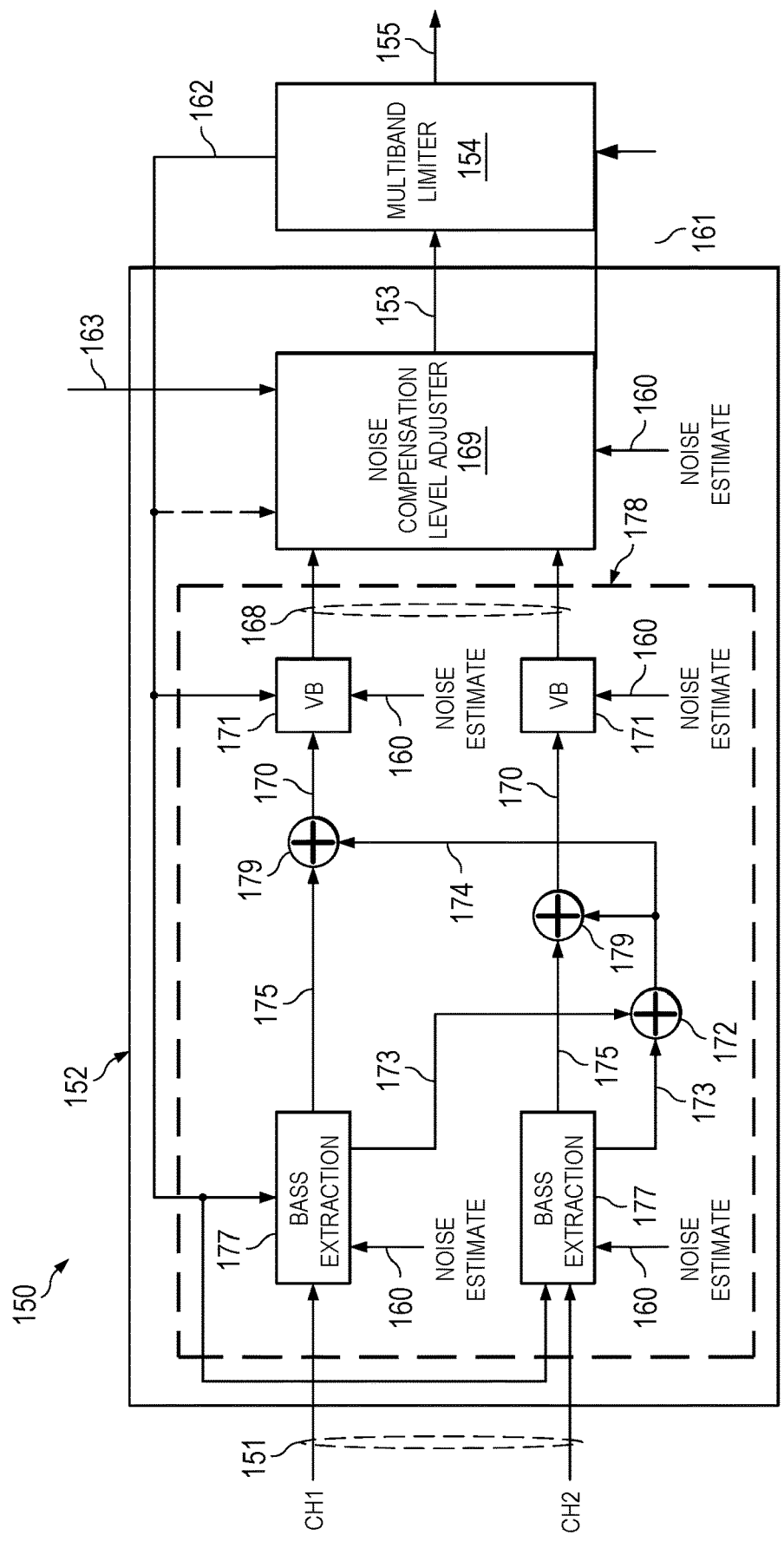
FIG. 10 shows an example of a floor plan of an audio environment, which is a living space in this example.

FIG. 10 shows an example of a floor plan of an audio environment, which is a living space in this example. As with other figures provided herein, the types and numbers of elements shown in FIG. 10 are merely provided by way of example. Other implementations may include more, fewer and/or different types and numbers of elements.

According to this example, the environment 1000 includes a living room 1010 at the upper left, a kitchen 1015 at the lower center, and a bedroom 1022 at the lower right. Boxes and circles distributed across the living space represent a set of loudspeakers 1005a-1005h, at least some of which may be smart speakers in some implementations, placed in locations convenient to the space, but not adhering to any standard prescribed layout (arbitrarily placed). In some examples, the television 1030 may be configured to implement one or more disclosed embodiments, at least in part. In this example, the environment 1000 includes cameras 1011a-1011e, which are distributed throughout the environment. In some implementations, one or more smart audio devices in the environment 1000 also may include one or more cameras. The one or more smart audio devices may be single purpose audio devices or virtual assistants. In some such examples, one or more cameras of the optional sensor system 130 may reside in or on the television 1030, in a mobile phone or in a smart speaker, such as one or more of the loudspeakers 1005b, 1005d, 1005e or 1005h. Although cameras 1011a-1011e are not shown in every depiction of the environment 1000 presented in this disclosure, each of the environments 1000 may nonetheless include one or more cameras in some implementations.

Some aspects of present disclosure include a system or device configured (e.g., programmed) to perform one or more examples of the disclosed methods, and a tangible computer readable medium (e.g., a disc) which stores code for implementing one or more examples of the disclosed methods or steps thereof. For example, some disclosed systems can be or include a programmable general purpose processor, digital signal processor, or microprocessor, programmed with software or firmware and/or otherwise configured to perform any of a variety of operations on data, including an embodiment of disclosed methods or steps thereof. Such a general purpose processor may be or include a computer system including an input device, a memory, and a processing subsystem that is programmed (and/or otherwise configured) to perform one or more examples of the disclosed methods (or steps thereof) in response to data asserted thereto.

Some embodiments may be implemented as a configurable (e.g., programmable) digital signal processor (DSP) that is configured (e.g., programmed and otherwise configured) to perform required processing on audio signal(s), including performance of one or more examples of the disclosed methods. Alternatively, embodiments of the disclosed systems (or elements thereof) may be implemented as a general purpose processor (e.g., a personal computer (PC) or other computer system or microprocessor, which may include an input device and a memory) which is programmed with software or firmware and/or otherwise configured to perform any of a variety of operations including one or more examples of the disclosed methods. Alternatively, elements of some embodiments of the inventive system are implemented as a general purpose processor or DSP configured (e.g., programmed) to perform one or more examples of the disclosed methods, and the system also includes other elements (e.g., one or more loudspeakers and/or one or more microphones). A general purpose processor configured to perform one or more examples of the disclosed methods may be coupled to an input device (e.g., a mouse and/or a keyboard), a memory, and a display device.

Another aspect of present disclosure is a computer readable medium (for example, a disc or other tangible storage medium) which stores code for performing (e.g., coder executable to perform) one or more examples of the disclosed methods or steps thereof.

While specific embodiments of the present disclosure and applications of the disclosure have been described herein, it will be apparent to those of ordinary skill in the art that many variations on the embodiments and applications described herein are possible without departing from the scope of the disclosure described and claimed herein. It should be understood that while certain forms of the disclosure have been shown and described, the disclosure is not to be limited to the specific embodiments described and shown or the specific methods described.

The invention claimed is:

1. An audio processing method, comprising:
receiving, by a control system and via an interface system, a content stream that includes input audio data;
applying, by the control system, a multiband limiter to the audio data or to a processed version of the audio data, to produce multiband limited audio data;
determining whether the multiband limited audio data would cause one or more audio reproduction transducers of an audio environment to operate outside a linear range when played back over the one or more audio reproduction transducers;
controlling, by the control system, an update of one or more filter coefficients by an acoustic echo canceller or an update of a noise estimate by a noise estimator based upon the determination whether the multiband limited audio data would cause the one or more audio reproduction transducers of the audio environment to operate outside the linear range; and
providing the multiband limited audio data to the one or more audio reproduction transducers of the audio environment;
wherein controlling an update of the one or more filter coefficients by the acoustic echo canceller involves controlling the acoustic echo canceller to not update the one or more filter coefficients if the multiband limited audio data would cause the one or more audio reproduction transducers of the audio environment to operate outside the linear range; and
wherein controlling an update of the noise estimate by the noise estimator involves controlling the noise estimator to not provide updated noise estimates if the multiband limited audio data would cause the one or more audio reproduction transducers of the audio environment to operate outside the linear range.

2. The audio processing method of claim 1, further comprising:
receiving, by the control system, at least one type of level adjustment indication relating to playback of the audio data;
determining, by the control system and based at least in part on the at least one type of level adjustment indication, a multiband limiter configuration; and
configuring, by the control system, the multiband limiter according to the multiband limiter configuration.

3. The audio processing method of claim 2, further comprising controlling, by the control system, a level of the input audio data, based on the at least one type of level adjustment indication, to produce level-adjusted audio data, wherein applying the multiband limiter to the audio data or to the processed version of the audio data involves applying the multiband limiter to the level-adjusted audio data.

4. The audio processing method of claim 2, wherein the at least one type of level adjustment indication includes at least one of a user input level adjustment indication received via user input or a noise compensation level adjustment indication received from a noise compensation module that includes the acoustic echo canceller.

5. The method of claim 4, wherein determining the multiband limiter configuration involves determining a timbre-preserving configuration if receiving the at least one type of level adjustment indication involves receiving the user input level adjustment indication.

6. The method of claim 4, wherein determining the multiband limiter configuration involves changing a timbre-preserving functionality if receiving the at least one type of level adjustment indication involves receiving the noise compensation level adjustment indication.

7. The method of claim 6, wherein changing the timbre-preserving functionality involves at least partially disabling the timbre-preserving functionality.

8. The method of claim 6, wherein the noise compensation level adjustment indication corresponds with a level of ambient noise in the audio environment and wherein changing the timbre-preserving functionality involves changing the timbre-preserving functionality based, at least in part, on the level of ambient noise.

9. The method of claim 8, further comprising reproducing the multiband limited audio data on the one or more audio reproduction transducers of the audio environment to provide reproduced audio data, further comprising determining a masking effect of the level of ambient noise on the reproduced audio data, wherein changing the timbre-preserving functionality involves changing the timbre-preserving functionality based, at least in part, on the masking effect.

10. The method of claim 5, wherein the timbre-preserving configuration is frequency band dependent.

11. The method of claim 4, wherein receiving the at least one type of level adjustment indication involves receiving both the user input level adjustment indication and the noise compensation level adjustment indication and wherein determining the multiband limiter configuration involves determining a timbre-preserving configuration that is based, at least in part, on a weighted average of the user input level adjustment indication and the noise compensation level adjustment indication.

12. The method of claim 1, wherein the control system causes the one or more audio reproduction transducers of the audio environment to operate outside the linear range based, at least in part, on a noise compensation level adjustment indication that corresponds to a high level of ambient noise in the audio environment.

13. The method of claim 4, further comprising causing an additional noise compensation module operation change when the multiband limited audio data causes one or more audio reproduction transducers of the audio environment to operate outside the linear range.

14. The method of claim 13, wherein the additional noise compensation module operation change involves causing the noise compensation module to use only quiet playback intervals as input to a noise estimator of the noise compensation module, the quiet playback intervals being instances during which audio reproduction transducers of the audio environment are acting within their linear ranges.

15. The method of claim 4, wherein the noise compensation module is a subsystem of the control system.

16. The method of claim 3, wherein a level adjuster module of the control system is configured for controlling the level of the input audio data to produce the level-adjusted audio data, further comprising providing multiband limiter feedback from the multiband limiter to the level adjuster module.

17. The method of claim 16, wherein the multiband limiter feedback indicates an amount of limiting that the multiband limiter is applying to each of a plurality of frequency bands of the level-adjusted audio data.

18. The method of claim 17, further comprising controlling, by the level adjuster module, a level of one or more frequency bands of the plurality of frequency bands based, at least in part, on the multiband limiter feedback.

19. An apparatus comprising a processor and a memory coupled to the processor and storing instructions for execution by the processor, wherein the processor is configured to perform the method of claim 1.

20. A system comprising an interface system and a control system configured for implementing the method of claim 1.

21. One or more non-transitory media having software stored thereon, the software including instructions for controlling one or more processors to perform the method of claim 1.

* * * * *